United States Patent
Liu et al.

(10) Patent No.: US 9,484,308 B2
(45) Date of Patent: Nov. 1, 2016

(54) SEMICONDUCTOR DEVICE

(71) Applicant: TAIWAN SEMICONDUCTOR MANUFACTURING COMPANY LTD., Hsinchu (TW)

(72) Inventors: Ming-Kai Liu, Hsinchu (TW); Chao-Wen Shih, Hsinchu County (TW); Yung-Ping Chiang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/314,779

(22) Filed: Jun. 25, 2014

(65) Prior Publication Data

US 2015/0380357 A1    Dec. 31, 2015

(51) Int. Cl.
| | |
|---|---|
| *H01L 29/40* | (2006.01) |
| *H01L 23/544* | (2006.01) |
| *H01L 23/00* | (2006.01) |
| *H01L 23/58* | (2006.01) |
| *H01L 23/31* | (2006.01) |

(52) U.S. Cl.
CPC .......... *H01L 23/544* (2013.01); *H01L 23/585* (2013.01); *H01L 24/11* (2013.01); *H01L 24/13* (2013.01); *H01L 23/3114* (2013.01); *H01L 23/564* (2013.01); *H01L 2223/5442* (2013.01); *H01L 2223/54426* (2013.01); *H01L 2223/54453* (2013.01); *H01L 2224/03002* (2013.01); *H01L 2224/11002* (2013.01); *H01L 2224/16105* (2013.01); *H01L 2224/16145* (2013.01); *H01L 2225/06513* (2013.01)

(58) Field of Classification Search
CPC ....... H01L 24/13; H01L 24/11; H01L 23/16; H01L 23/564; H01L 22/12; H01L 29/7875; H01L 29/7878; H01L 51/5271; H01L 51/5268; H01L 51/0096; H01L 51/56

USPC .................................................. 257/684, 774
See application file for complete search history.

(56) References Cited

U.S. PATENT DOCUMENTS

2013/0341800 A1* 12/2013  Tu ........................... H01L 21/78
                                                                          257/774
2014/0353819 A1* 12/2014  Chuang ................... H01L 21/56
                                                                          257/737

FOREIGN PATENT DOCUMENTS

KR    10-2014-0035786        3/2014

OTHER PUBLICATIONS

Office action issued by Korean Intellectual Property Office on Apr. 21, 2016.

*Primary Examiner* — Dung Le
(74) *Attorney, Agent, or Firm* — Chun-Ming Shih

(57) ABSTRACT

A semiconductor device includes a substrate including a pad and an alignment feature disposed over the substrate, a passivation disposed over the substrate and a periphery of the pad, a post passivation interconnect (PPI) including a via portion disposed on the pad and an elongated portion receiving a conductive bump to electrically connect the pad with the conductive bump, a polymer covering the PPI, and a molding material disposed over the polymer and around the conductive bump, wherein the molding material comprises a first portion orthogonally aligned with the alignment feature and adjacent to an edge of the semiconductor device and a second portion distal to the edge of the semiconductor device, a thickness of the first portion is substantially smaller than a thickness of the second portion, thereby the alignment feature is visible through the molding material under a predetermined radiation.

20 Claims, 22 Drawing Sheets

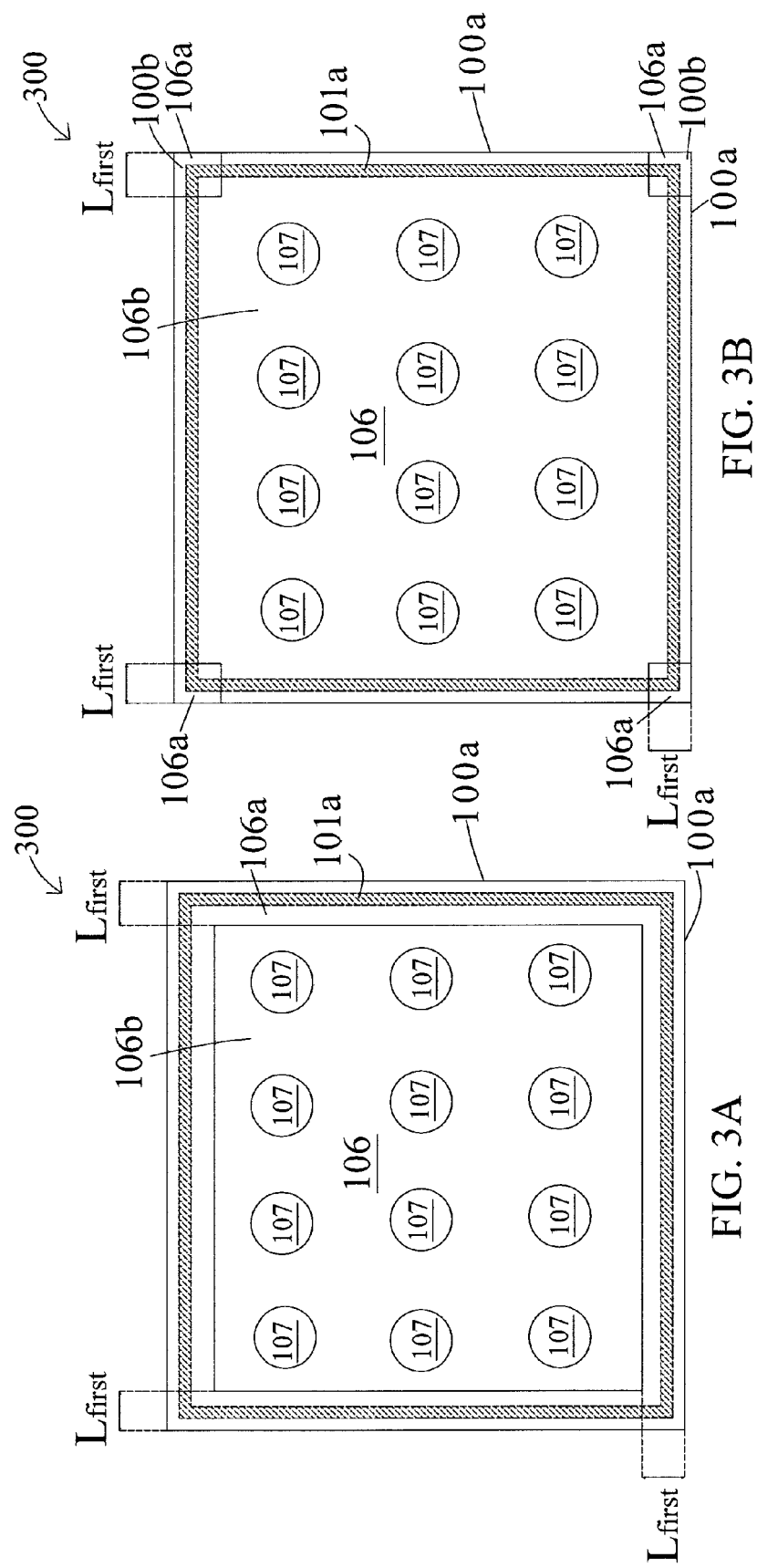

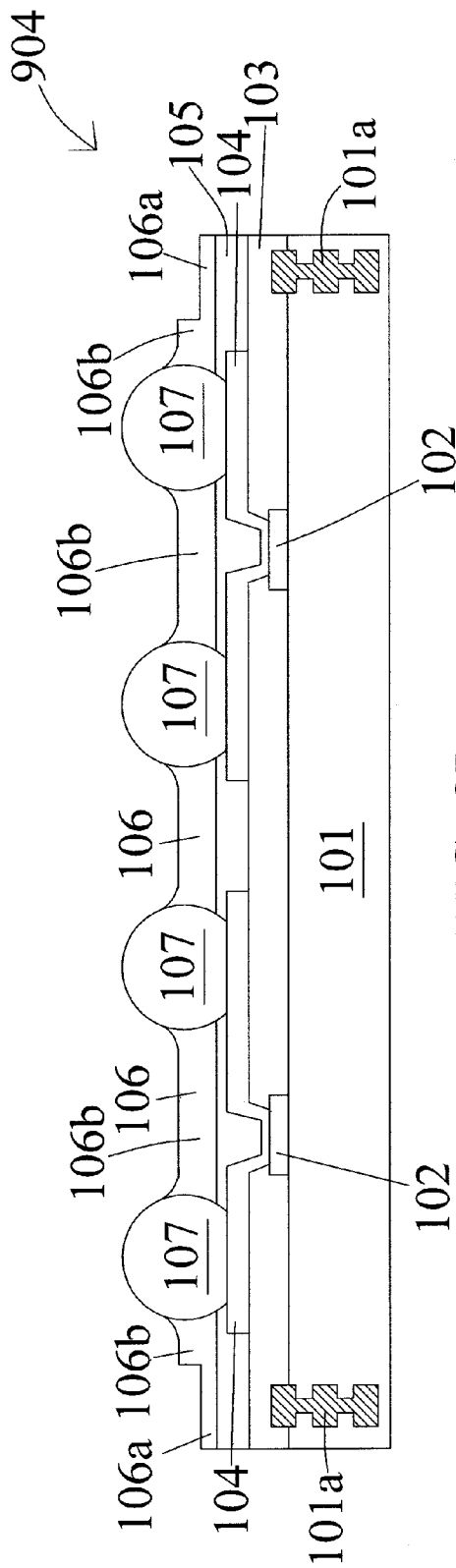
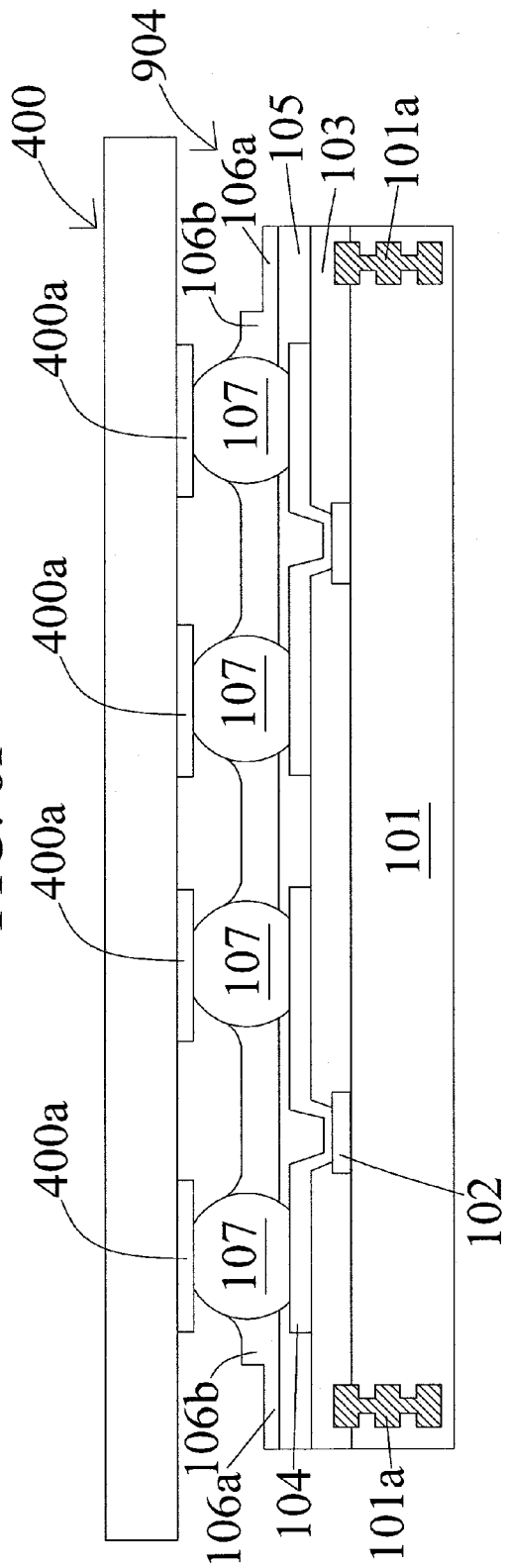
FIG. 8I
FIG. 8J

SEMICONDUCTOR DEVICE

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as inaccurate placement of components, poor electrical interconnection, development of cracks, delamination of the components or high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

Since more different components with different materials are involved, a complexity of the manufacturing operations of the semiconductor device is increased. There are more challenges to modify a structure of the semiconductor device and improve the manufacturing operations. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3A is a top view of a semiconductor device of FIG. 3 with a first portion of a molding material along edges of the semiconductor device in accordance with some embodiments of the present disclosure.

FIG. 3B is a top view of a semiconductor device of FIG. 3 with a first portion of a molding material at corners of the semiconductor device in accordance with some embodiments of the present disclosure.

FIG. 8I is a cross sectional view of a semiconductor device of FIG. 8H in accordance with some embodiments of the present disclosure.

FIG. 8J is a cross sectional view of a semiconductor device of FIG. 8I bonding with another substrate in accordance with some embodiments of the present disclosure.

DETAILED DESCRIPTION OF THE DISCLOSURE

Figure 1:
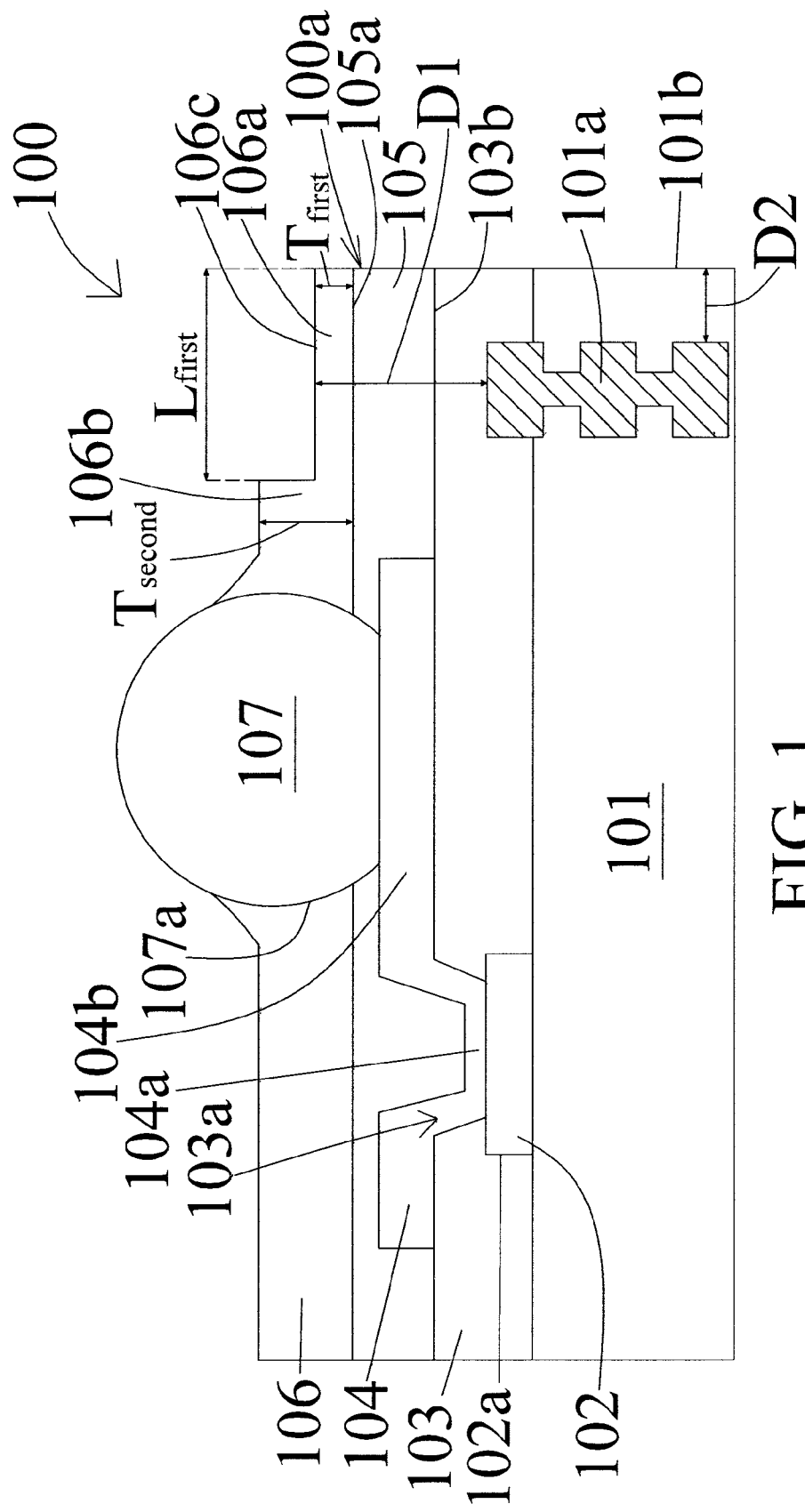
FIG. 1 is a schematic view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Dies are fabricated from a semiconductor wafer. The semiconductor wafer includes numbers of die areas. Various kinds of components such as conductive traces, polymers, conductive bumps or etc. are disposed over a front side of the die areas during fabrication. A molding material is disposed over the whole semiconductor wafer and covers the top surface of the semiconductor wafer to protect those components and the front side of each die area. The die areas are separated by several scribe line regions, which are defined on a top surface of the semiconductor wafer to facilitate the sawing operations. Furthermore, a feature or a mark is disposed on or within each die area to assist an alignment of the semiconductor wafer during the sawing operations.

However, the molding material disposed over the whole semiconductor wafer is opaque and is not penetrable by light. As such, the scribe line regions defined on the top surface of the semiconductor wafer and the feature are not visible through the molding material. It is undesirable for sawing the dies from the wafer without making any reference to the scribe line regions or the feature for alignment and calibration upon the die sawing operations. The die could not be accurately sawn out from the semiconductor wafer, and thus a reliability of each die would be decreased. Therefore, an accurate and precise die sawing operations could not be performed after disposing the opaque molding material over the semiconductor wafer.

In the present disclosure, a semiconductor device with a structural improvement is disclosed. The semiconductor device includes an opaque molding with a reduced height above an alignment feature. Some of the opaque molding disposed above the alignment feature is removed to thinner the opaque molding, such that the alignment feature is visible from a top of a front side of a semiconductor device under a predetermined radiation. With reference to the visible alignment feature, the semiconductor device could be singulated from a semiconductor wafer accurately even though the singulation is performed after disposition of the opaque molding. In addition, the opaque molding with the reduced height is disposed adjacent to an edge of the semiconductor device. In other words, a volume of the opaque molding disposed adjacent to the edge is lesser. As a result, a stress from the opaque molding adjacent to the edge is decreased and thus a reliability or performance of the semiconductor device is improved.

FIG. 1 is a semiconductor device 100 in accordance with various embodiments of the present disclosure. FIG. 1 shows a cross sectional view of the semiconductor device 100. In some embodiments, the semiconductor device 100 is a semiconductor die. In some embodiments, the semiconductor device 100 includes a substrate 101, a pad 102, an alignment feature 101a, a passivation 103, a post passivation interconnect (PPI) 104, a polymer 105, a molding material 106 and a conductive bump 107.

In some embodiments, the substrate 101 is a piece including semiconductor materials such as silicon and is fabricated with a predetermined functional circuit over the substrate 101 produced by various methods such as photolithography operations, etching or etc. In some embodiments, active devices (not shown) such as transistors are formed at a surface of the substrate 101. Some interconnect structures (not shown) including metal lines are formed over the substrate 101.

In some embodiments, the substrate 101 includes an alignment feature 101a. In some embodiments, the alignment feature 101a is disposed within or over the substrate 101 and adjacent to an edge 101b of the substrate 101. The alignment feature 101a can be in various configurations and shapes. In some embodiments, the alignment feature 101a is an alignment mark disposed on or within the substrate 101 for assisting alignment or calibration of a semiconductor wafer upon singulation of the semiconductor device 100 from the semiconductor wafer. In some embodiments, a cross section of the alignment mark from the top of the semiconductor device 100 is in a rectangular, triangular, quadrilateral or polygonal shape.

In some embodiments, the alignment feature 101a is a seal ring structure, which is configured for assisting alignment of a semiconductor wafer upon singulation of the semiconductor device 100 from the semiconductor wafer. In some embodiments, the seal ring structure prevents undesirable moisture and mobile ionic contaminants from penetrating into the substrate 101. In some embodiments, the seal ring structure is wholly or partially embedded in the substrate 101.

Figures 1A, 1B:
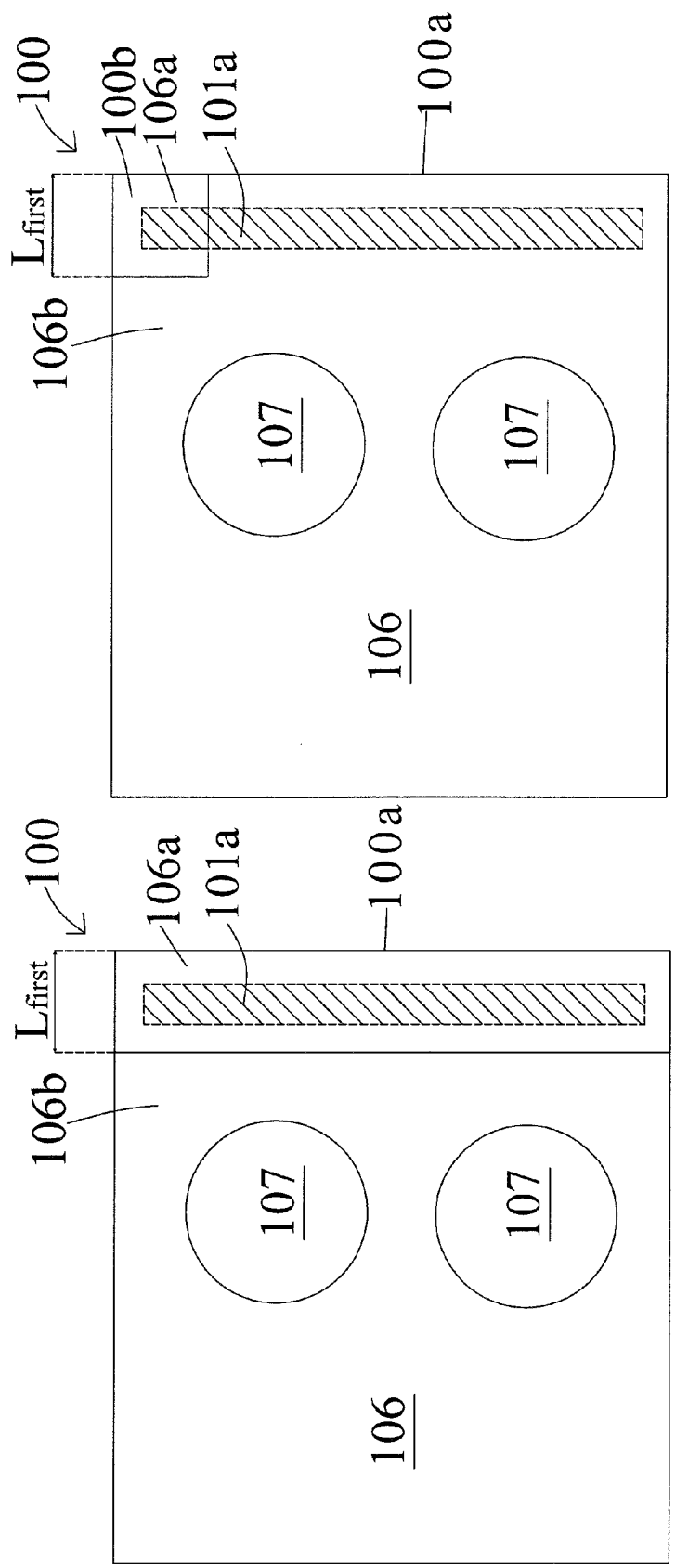
FIG. 1A is a top view of a semiconductor device of FIG. 1 with a first portion of a molding material along an edge of the semiconductor device in accordance with some embodiments of the present disclosure.
FIG. 1B is a top view of a semiconductor device of FIG. 1 with a first portion of a molding material at a corner of the semiconductor device in accordance with some embodiments of the present disclosure.

FIG. 1A is a top view of the semiconductor device 100 of FIG. 1 showing the alignment feature 101a configured as the seal ring structure. In some embodiments, the seal ring structure is covered by the passivation 103, the polymer 105 and the molding material 106, thus the seal ring structure is invisible from the top of the semiconductor device 100 under normal light (shown in broken lines). In some embodiments, the seal ring structure is elongated along the edge 101b of the substrate 101. In some embodiments, a cross section of the seal ring structure from the top of the semiconductor device 100 is in a rectangular, triangular, quadrilateral or polygonal shape. The seal ring structure is extended in a continuous line shape. In some embodiments, the seal ring structure includes at least one of metals or metal alloys.

Referring back to FIG. 1, the substrate 101 includes the pad 102 disposed over the substrate 101. In some embodiments, the pad 102 is electrically connected with the active devices or the interconnect structures of the substrate 101. In some embodiments, the pad 102 is made with aluminum (Al), copper (Cu), tin (Sn), nickel (Ni), gold (Au), silver (Ag), other electrically conductive materials, alloy thereof or multi layers thereof.

In some embodiments, the passivation 103 is disposed over the substrate 101 and a periphery 102a of the pad 102. In some embodiments, the passivation 103 includes an opening 103a for exposing a portion of the pad 102, such that the pad 102 can electrically connect with an interconnect structure. In some embodiments, the passivation 103 includes dielectric materials such as silicon oxide, silicon nitride, silicon oxynitride, polyimide (PI), benzocyclobutene (BCB), polybenzoxazole (PBO) or other insulting materials.

In some embodiments, the post passivation interconnect (PPI) 104 is disposed over the passivation 103 and the portion of the pad 102 exposed from the passivation 103. In some embodiments, the PPI 104 electrically connects with the pad 102. In some embodiments, the PPI 104 includes copper, aluminum or other conductive materials. In some embodiments, the PPI 104 is a conductive line electrically connecting the pad 102 with a conductive bump 107 seating on a portion of the conductive line.

In some embodiments, the PPI 104 includes a via portion 104a disposed on the pad 102 and an elongated portion 104b receiving the conductive bump 107 to electrically connect the pad 102 with the conductive bump 107. In some embodiments, the via portion 104a is disposed within the opening 103a and contacts with the portion of the pad 102 exposed from the passivation 103. In some embodiments, the via portion 104a is conformal to a sidewall of the opening 103a.

In some embodiments, the elongated portion 104b is disposed on the passivation 103. In some embodiments, the elongated portion 104b is conformal to a surface 103b of the passivation 103. In some embodiments, the elongated portion 104b is configured for the conductive bump 107 seating thereon, so that the pad 102 is electrically connected with the conductive bump 107 by the PPI 104. In some embodiments, a bump pad such as under bump metallurgy (UBM) pad is disposed over the elongated portion 104b of the PPI 104 and is configured for receiving the conductive bump 107, such that the pad 102 is electrically connected with the conductive bump 107 by the PPI 104 and the UBM pad.

In some embodiments, the conductive bump 107 is in a hemispherical shape as a solder ball. In some embodiments, the conductive bump 107 includes metals such as lead, tin copper, gold, nickel, etc. or metal alloy such as combination of lead, tin copper, gold, nickel, etc.

In some embodiments, the polymer 105 covers the PPI 104. In some embodiments, the polymer 105 is disposed over the PPI 104 and the passivation 103. In some embodiments, the polymer 105 is configured for protecting the PPI 104. In some embodiments, the polymer 105 is conformed to the PPI 104 and the surface 103b of the passivation 103. In some embodiments, the polymer 105 includes polymide (PI), benzocyclobutene (BCB), polybenzoxazole (PBO) or the like.

In some embodiments, the molding material 106 is disposed over the polymer 105 and around the conductive bump 107. In some embodiments, the molding material 106 is conformal to a surface of the polymer 105 and a portion 107a of an external surface of the conductive bump 107. The conductive bump 107 is partially encapsulated by the molding material 106.

In some embodiments, the molding material 106 is formed with composite materials including epoxy resins, phenolic hardeners, silicas, catalysts, pigments and mold release agents. In some embodiments, the molding material 106 has a high thermal conductivity, a low moisture absorption rate, a high flexural strength at board-mounting temperatures, or a combination of these. In some embodiments, the molding material 106 is a liquid molding compound (LMC). In some embodiments, the molding material 106 is opaque or is black in color. In some embodiments, the molding material 106 is an opaque molding surrounding the conductive bump 107.

In some embodiments, the molding material 106 adjacent to an edge 100a of the semiconductor device 100 is in a stepped configuration. In some embodiments, the molding material 106 includes a first portion 106a and a second portion 106b. In some embodiments, the first portion 106a is orthogonally aligned with the alignment feature 101a. In some embodiments, the first portion 106a of the molding material 106 has a thickness $T_{first}$ of about 10 um to about 30 um. In some embodiments, the first portion 106a has a length $L_{first}$ of about 20 um to about 40 um.

In some embodiments, the first portion 106a is disposed above the alignment feature 101a. In some embodiments, the first portion 106a is adjacent to the edge 100a of the semiconductor device 100. In some embodiments, the first portion 106a is elongated along the edge 100a and is extended in a rectangular or quadrilateral shape as shown in FIG. 1A. In some embodiments, a surface area of the first portion 106a is substantially greater than a surface area of the alignment feature 101a.

FIG. 1B shows a top view of the semiconductor device 100 with the first portion 106a disposed at a corner 100b of the semiconductor device 100. In some embodiments, the first portion 106a is disposed at the corner 100b and is orthogonally aligned with a portion of the alignment feature 101a.

Referring back to FIG. 1, there is a distance D1 between the alignment feature 101a and a top surface 106c of the first portion 106a of the molding material 106. In some embodiments, the alignment feature 101a is disposed away from the top surface 106c of the first portion 106a in the distance D1 of about 20 um. In some embodiments, the alignment feature 101a is disposed away from the edge 100a of the semiconductor device 100 in a distance D2. In some embodiments, the distance D2 between the alignment feature 101a and the edge 100a is about 20 um.

In some embodiments, the second portion 106b of the molding material 106 is disposed distal to the edge 100a of the semiconductor device 100. In some embodiments, the second portion 106b is not disposed above or not orthogonally aligned with the alignment feature 101a. In some embodiments, the second portion 106b of the molding material 106 is opaque and is impenetrable by a predetermined radiation such as infra-red (IR). The second portion 106b is impenetrable by the IR when a thickness $T_{second}$ of the second portion 106b is greater than about 40 um. In some embodiments, the second portion 106b has the thickness $T_{second}$ of about 100 um to about 120 um.

In some embodiments, the thickness $T_{first}$ of the first portion 106a is substantially smaller than the thickness $T_{second}$ of the second portion 106b. In some embodiments, the thickness $T_{first}$ of the first portion 106a is about 90 um less than the thickness $T_{second}$ of the second portion 106b. As the first portion 106a is thinner than the second portion 106b, the alignment feature 101a disposed underneath the first portion 106a is visible through the molding material 106 under the predetermined radiation.

In some embodiments, the alignment feature 101a is visible under the IR through the first portion 106a from the top of the semiconductor device 100. The alignment feature 101a under the IR can assist alignment operations during singulation of the semiconductor device 100 from a semiconductor wafer, so that the alignment operations can be performed precisely and the semiconductor device 100 can be singulated from the semiconductor wafer accurately.

Figure 2:
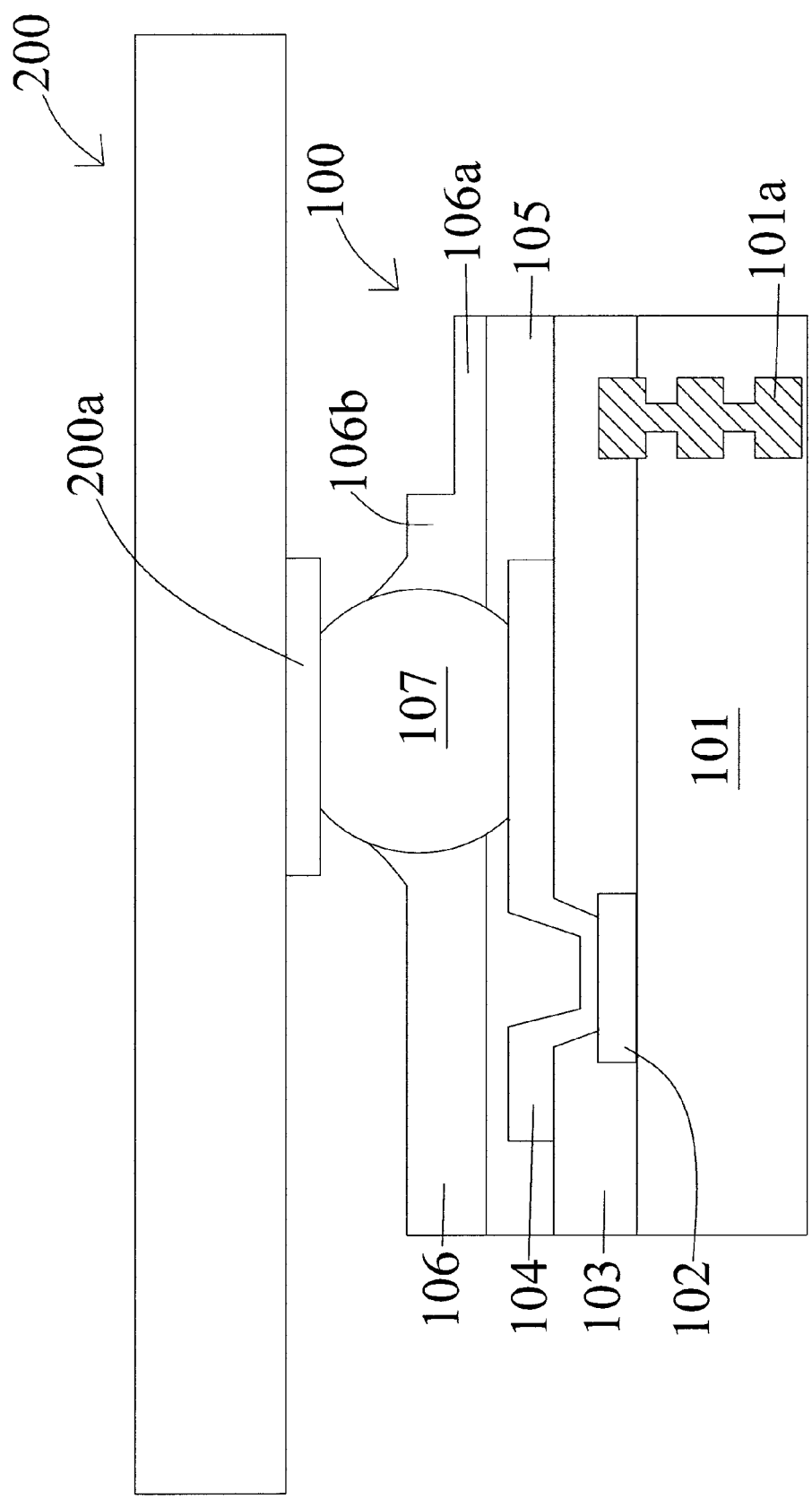
FIG. 2 is a cross sectional view of a semiconductor device of FIG. 1 bonding with another substrate in accordance with some embodiments of the present disclosure.

FIG. 2 is an embodiment of the semiconductor device 100 bonded with another semiconductor device 200. In some embodiments, the semiconductor device 100 is electrically connected with another semiconductor device 200 by bonding the conductive bump 107 of the semiconductor device 100 with a bond pad 200a of the semiconductor device 200. Therefore, the substrate 101, the pad 102, the PPI 104 are electrically connected with a circuitry of the semiconductor device 200 by the conductive bump 107 and the bond pad 200a.

Figure 3:
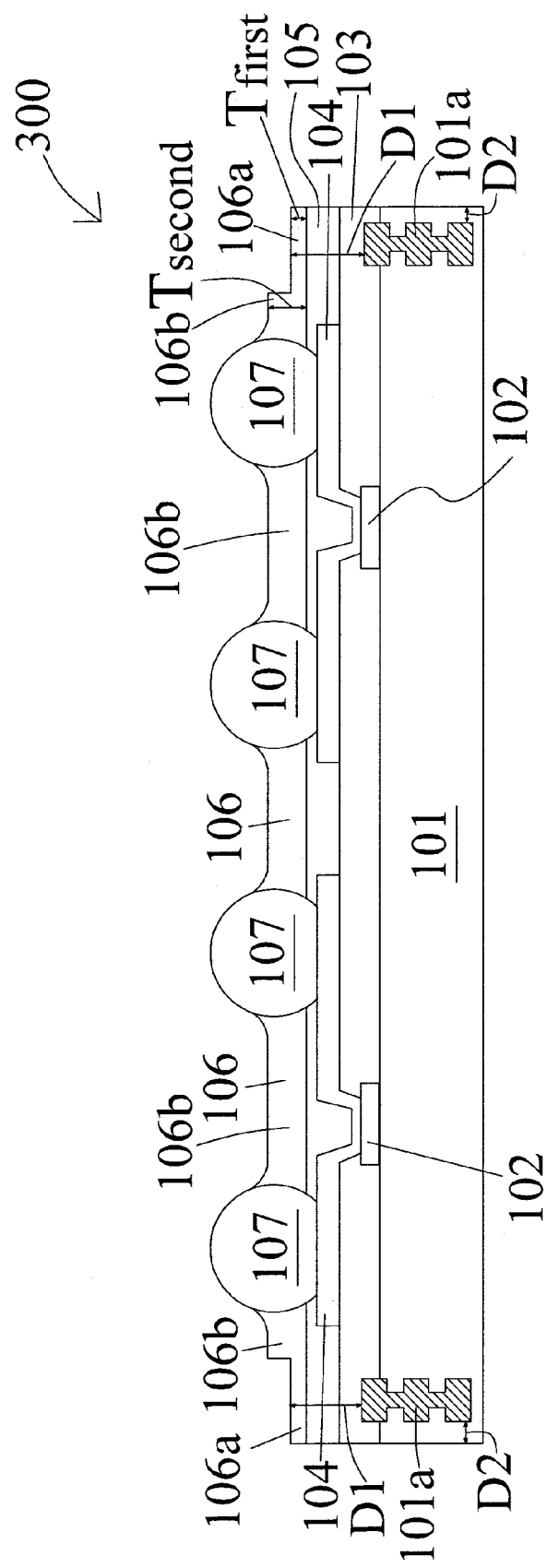
FIG. 3 is a schematic view of a semiconductor device in accordance with some embodiments of the present disclosure.

FIG. 3 is an embodiment of the semiconductor device 300 in accordance with various embodiments of the present disclosure. FIG. 3 is a cross sectional view of the semiconductor device 300. In some embodiments, the semiconductor device 300 includes a substrate 101, a pad 102, an alignment feature 101a, a passivation 103, a post passivation interconnect (PPI) 104, a polymer 105, a molding 106 and a conductive bump 107, which have similar configuration as in FIG. 1.

In some embodiments, the molding 106 has a reduced height $T_{first}$ along edges 100a of the semiconductor device 300 as shown in FIG. 3A which is a top view of the semiconductor device 300 of FIG. 3. In some embodiments, the molding 106 with the reduced height $T_{first}$ is disposed corresponding to a position of the alignment feature 101a. In some embodiments, the molding 106 the molding 106 with the reduced height $T_{first}$ is disposed above or orthogonally aligned with the alignment feature 101a. In some embodiments, the molding 106 with the reduced height $T_{first}$ is about 20 um.

In some embodiments as shown in FIG. 3A, the molding 106 with the reduced height $T_{first}$ is extended along the edges 100a in a consistent width $L_{first}$ in a similar manner as in FIG. 1A. In some embodiments as shown in FIG. 3B, the molding 106 with the reduced height $T_{first}$ is disposed at corners 100b of the semiconductor device 300 in a similar manner as in FIG. 1B. The molding 106 above a portion of the alignment feature 101a at each corner 100b is in the reduced height $T_{first}$. As the molding 106 above the alignment feature 101a or the portion of the alignment feature 101a is in the reduced height $T_{first}$ thinner than rest of the molding 106 in a height $T_{second}$, the alignment feature 101a is visible through the molding 106 under a predetermined radiation such as IR.

Figure 4:
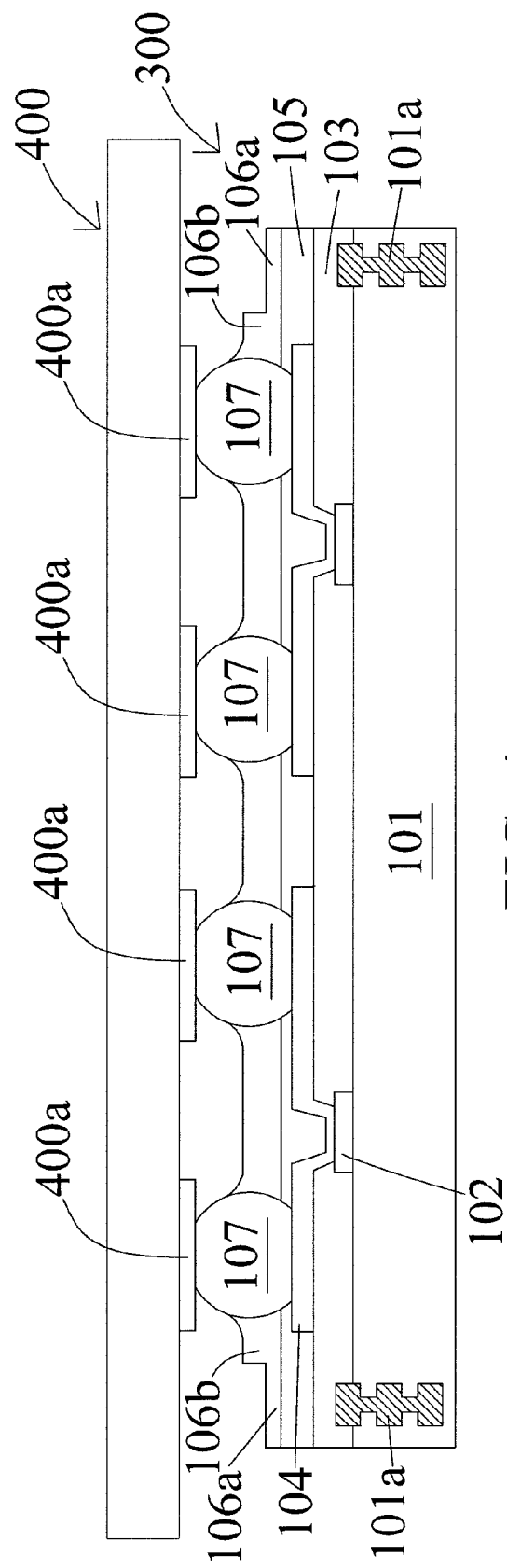
FIG. 4 is a cross sectional view of a semiconductor device of FIG. 3 bonding with another substrate in accordance with some embodiments of the present disclosure.

FIG. 4 is an embodiment of the semiconductor device 300 bonded with another semiconductor device 400. In some embodiments, the semiconductor device 300 is electrically connected with another semiconductor device 400 by bonding the conductive bumps 107 of the semiconductor device 300 with corresponding bond pads 400a of the semiconductor device 400, in similar manner as in FIG. 2.

Figure 5:
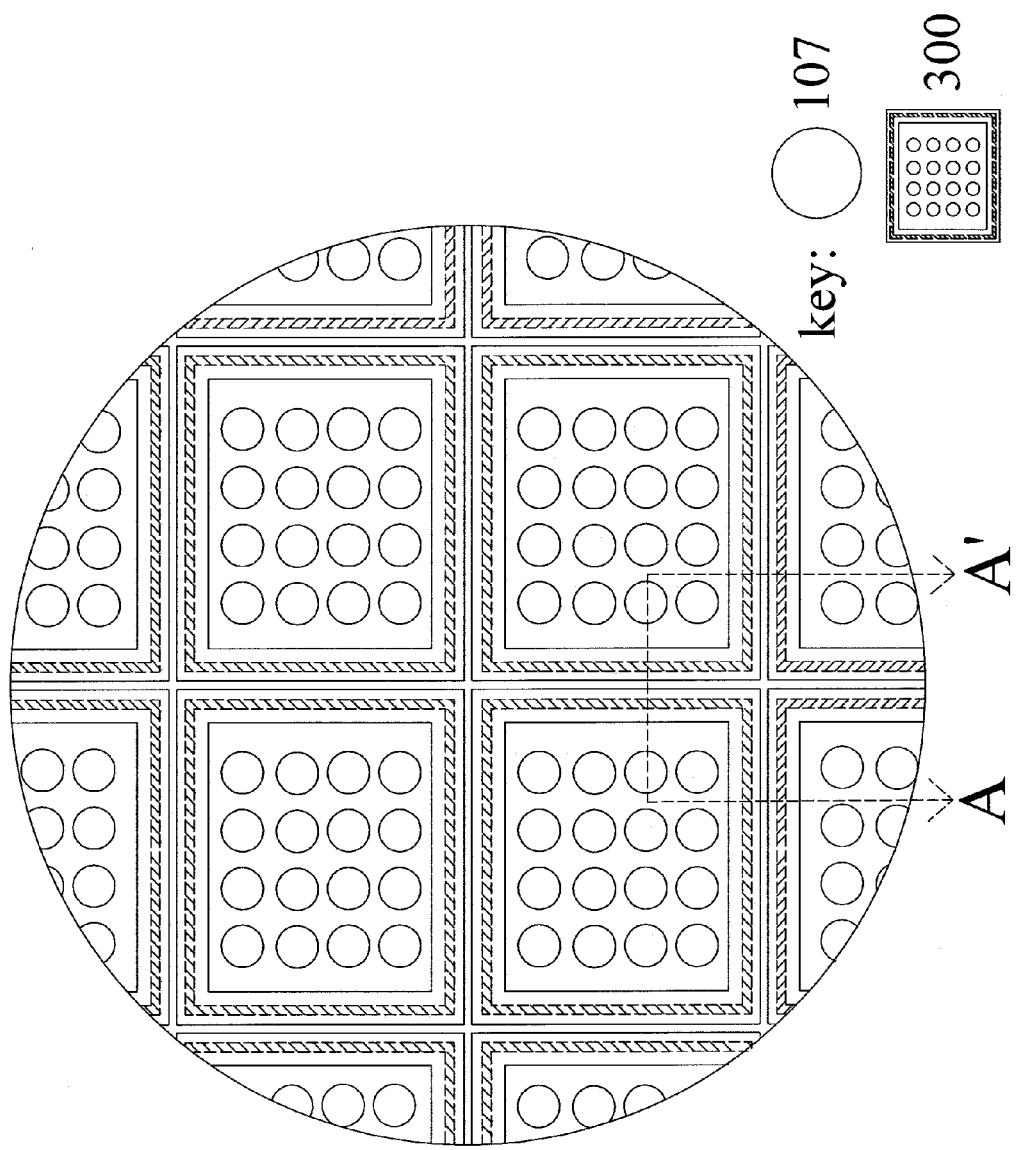
FIG. 5 is a top view of semiconductor devices arranged in an array in accordance with some embodiments of the present disclosure.
Figure 5A:
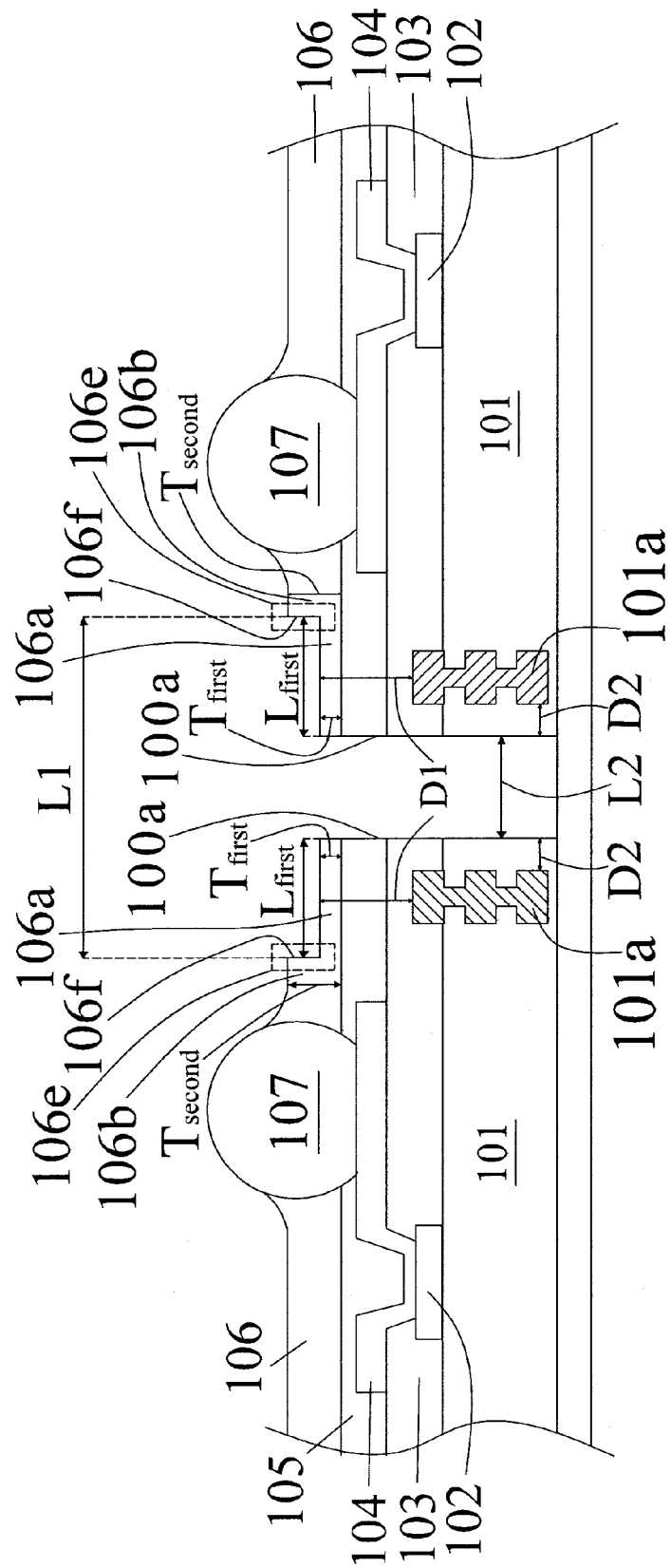
FIG. 5A is a cross sectional view of adjacent semiconductor devices of FIG. 5 along AA' in accordance with some embodiments of the present disclosure.

FIG. 5 is a top view of an embodiment including several semiconductor devices 300 arranged in a regular array. In some embodiments, the semiconductor devices are arranged and aligned with each other horizontally and vertically. FIG. 5A is a cross sectional view of the adjacent semiconductor devices 300 of FIG. 5 along AA'. In some embodiments, the semiconductor devices 300 are separated from each other in a length L2. In some embodiments, the length L2 is a distance between edges 100a of the adjacent semiconductor devices 300. In some embodiments, the length L2 is about 25 um to about 35 um.

In some embodiments, each of the semiconductor devices 300 includes the first portion 106a and the second portion 106b. In some embodiments, the first portion 106a and the second portion 106b are disposed adjacent to each other, and the thickness $T_{first}$ of the first portion 106a is different and smaller than the thickness $T_{second}$ of the second portion 106b. Thus, the molding 106 is in the stepped configuration 106e adjacent to the edge 100a of the semiconductor device 300.

In some embodiments, the second portions 106b of the semiconductor devices 300 are opposite to each other and are distanced from each other in a distance L1. In some embodiments, the distance L1 is a horizontal distance between sidewalls 106f of the second portions 106b of the semiconductor devices 300. In some embodiments, the distance L1 is greater than about 100 um. In some embodiments, the distance L1 is about 80 um to about 120 um.

Figure 5B:
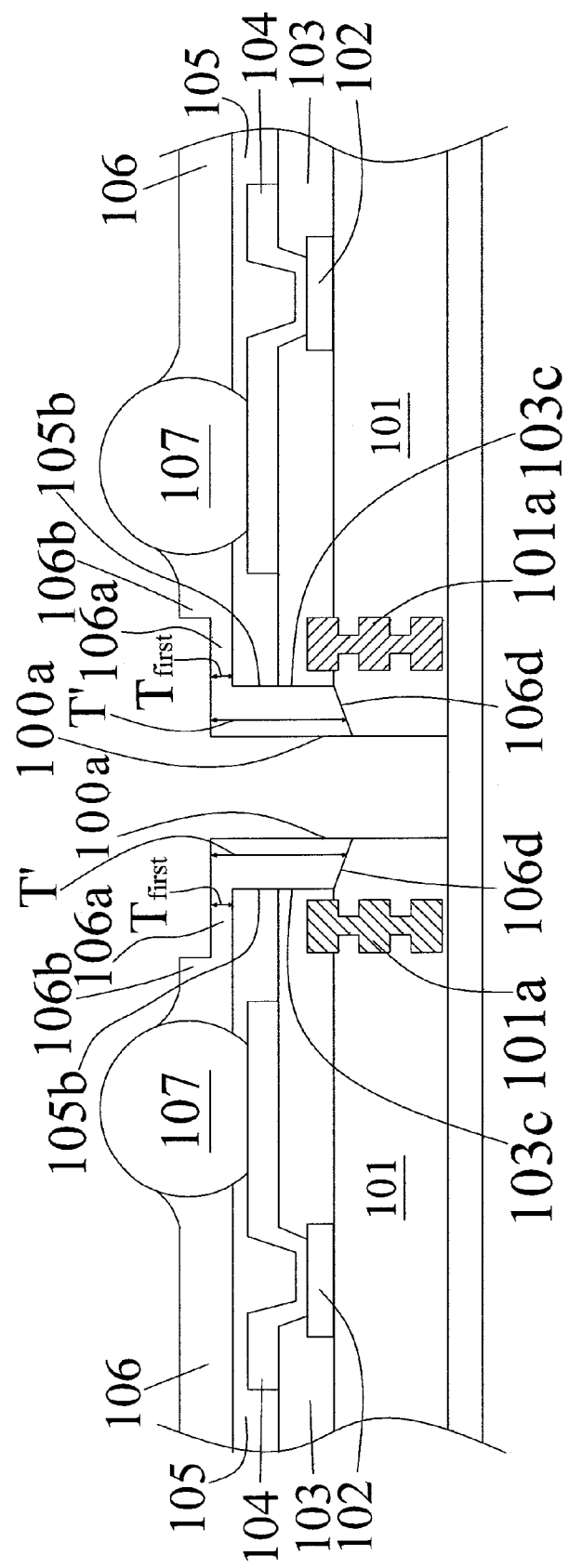
FIG. 5B is a schematic view of adjacent semiconductor devices with the molding material disposed on a portion of the substrate in accordance with some embodiments of the present disclosure.

FIG. 5B is a cross sectional view of another embodiment of the adjacent semiconductor devices 300 of FIG. 5 along AA'. In some embodiments, the first portion 106a of each semiconductor device 300 has an uneven thickness as shown in FIG. 5B. Some of the molding 106 is disposed over the substrate 101 for further protecting components such as inter-metal dielectrics (IMD) or extreme low dielectric constant (ELK) materials within the substrate 101.

In some embodiments, the first portion 106a of the molding 106 has a thickness T' disposed between the edge 100a and a sidewall 103c of the passivation 103 or a sidewall 105b of the polymer 105. In some embodiments, the thickness T' is greater than the thickness $T_{first}$ of the first portion 106a disposed above the alignment feature 101a. In some embodiments, an interface 106d between the substrate 101 and the molding 106 is sloped towards the edge 100a, thus the thickness T' of the first portion 106a is increased towards the edge 100a.

In the present disclosure, a method of manufacturing a semiconductor device is also disclosed. In some embodiments, a semiconductor device is formed by a method 600. The method 600 includes a number of operations and the description and illustration are not deemed as a limitation as the sequence of the operations.

Figure 6:
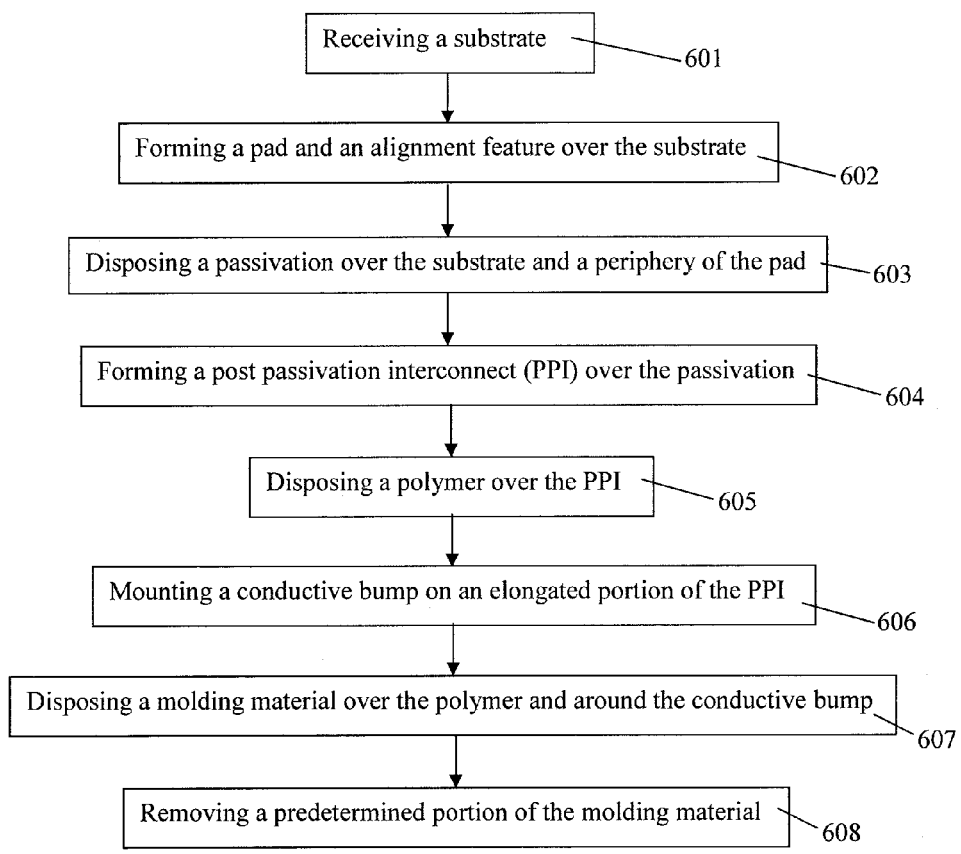
FIG. 6 is a flow diagram of a method of manufacturing a semiconductor device in accordance with some embodiments of the present disclosure.

FIG. 6 is a diagram of a method 600 of manufacturing a semiconductor device in accordance with various embodiments of the present disclosure. The method 600 includes a number of operations (601, 602, 603, 604, 505, 606, 607 and 608).

Figure 6A:
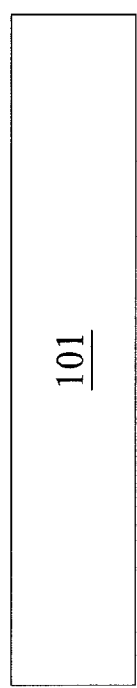
FIG. 6A is a schematic view of a substrate in accordance with some embodiments of the present disclosure.

In operation 601, a substrate 101 is received or provided as in FIG. 6A. In some embodiments, the substrate 101 is a silicon substrate. In some embodiments, the substrate 101 has similar configuration as in FIG. 1 or FIG. 3.

Figure 6C:
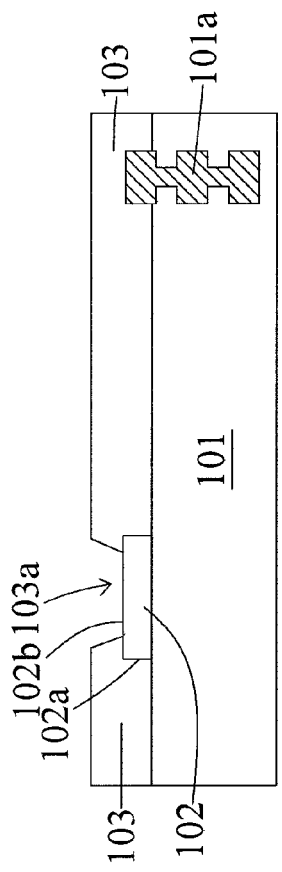
FIG. 6C is a schematic view of a passivation surrounding a pad in accordance with some embodiments of the present disclosure.
Figure 6B:
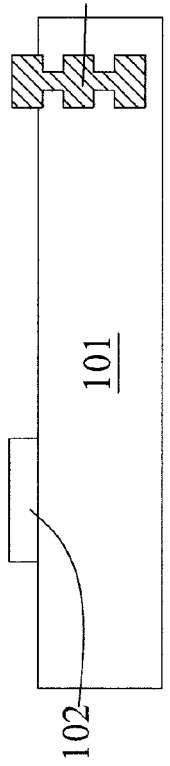
FIG. 6B is a schematic view of a pad and an alignment feature disposed over a substrate in accordance with some embodiments of the present disclosure.

In operation 602, a pad 102 and an alignment feature 101a are formed over the substrate 101 as in FIG. 6B. In some embodiments, the pad 102 is electrically connected with an interconnect structure or a circuitry internal to the substrate 101. In some embodiments, the pad 102 is disposed over the susbtrate 101 by various suitable operations such as electrolytic plating or electroless plating. In some embodiments, the pad 102 has similar configuration as in FIG. 1 or FIG. 3. In some embodiments, the alignment feature 101a is disposed on or within the substrate 101. In some embodiments, the alignment feature 101a is a seal ring structure. In some embodiments, the substrate 101 and the alignment feature 101a have similar configuration as in FIG. 1 or FIG. 3.

In operation 603, a passivation 103 is disposed over the substrate 101 and a periphery 102a of the pad 102 as in FIG. 6C. The passivation 103 covers the substrate 101 and surrounds the pad 102. In some embodiments, the passivation 103 includes an opening 103a by removing a portion of the passivation 103 using a mask defined photoresist etching to expose a portion of a top surface 102b of the pad 102. In some embodiments, the passivation 103 has similar configuration as in FIG. 1 or FIG. 3.

Figure 6D:
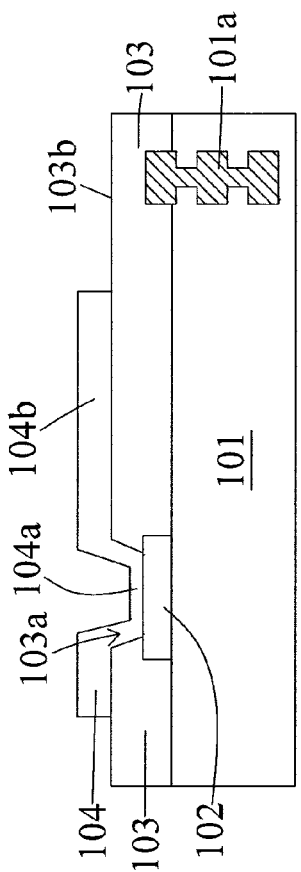
FIG. 6D is a schematic view of a post passivation interconnect (PPI) disposed on a passivation in accordance with some embodiments of the present disclosure.

In operation 604, a post passivation interconnect (PPI) 104 is formed over the passivation 103 as in FIG. 6D. In some embodiments, the PPI 104 is disposed conformal to the opening 103a and a surface 103b of the passivation 103. In some embodiments, the PPI 104 is formed by various suitable operations such as electrolytic plating or electroless plating. In some embodiments, a via portion 104a of the PPI 104 is formed within the opening 103a, and an elongated portion 104b is formed along the surface 103b. In some embodiments, the via portion 104a is contacted with the exposed portion of the top surface 102b of the pad 102. In some embodiments, the PPI 104 has similar configuration as in FIG. 1 or FIG. 3.

Figure 6E:
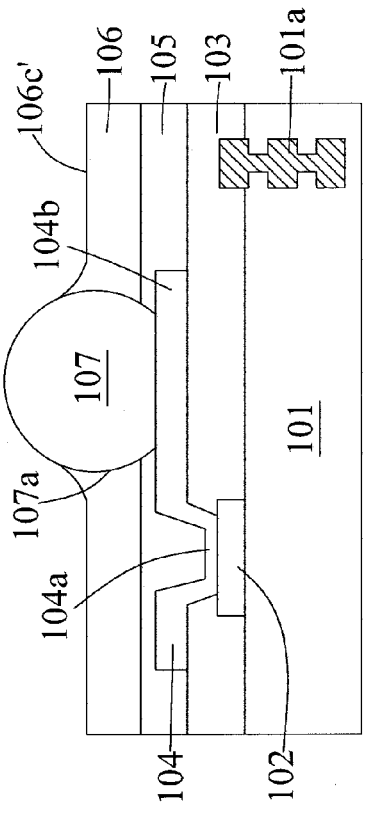
FIG. 6E is a schematic view of a polymer disposed on a post passivation interconnect (PPI) in accordance with some embodiments of the present disclosure.

In operation 605, a polymer 105 is disposed over the PPI 104 as in FIG. 6E. In some embodiments, the polymer 105 is disposed by various suitable methods such as spin coating. In some embodiments, a portion of the polymer 105 is removed to expose a portion of the elongated portion 104b of the PPI 104. In some embodiments, the polymer 105 includes an opening 105c formed by various suitable operations such as photolithography, etching or laser drilling In some embodiments, the opening 105c exposes the portion of the elongated portion 104b of the PPI 104 from the polymer 105. In some embodiments, the polymer 105 has similar configuration as in FIG. 1 or FIG. 3.

Figure 6G:
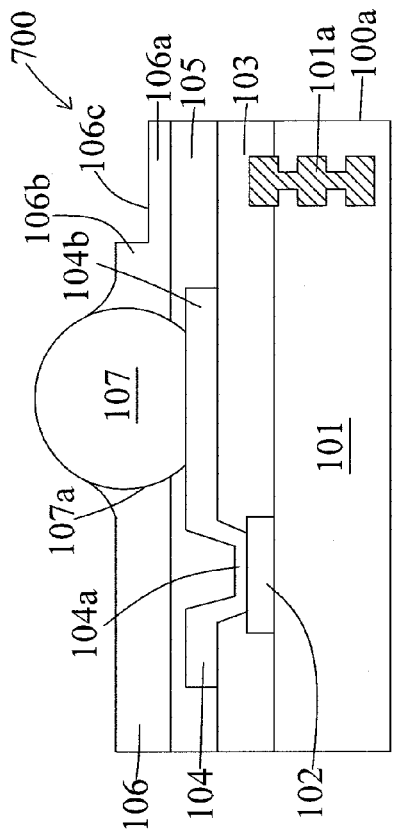
FIG. 6G is a schematic view of a molding material covering a polymer and surrounding a conductive bump in accordance with some embodiments of the present disclosure.
Figure 6F:
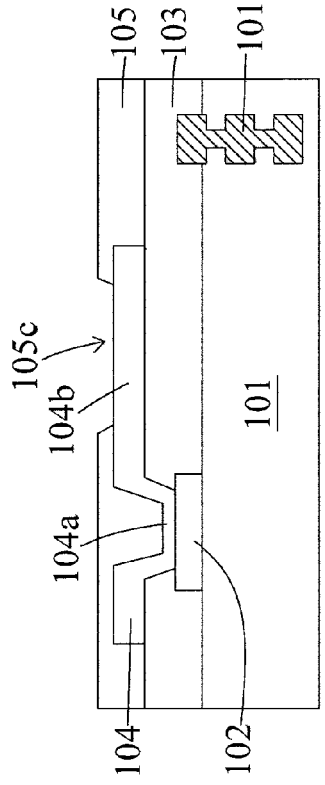
FIG. 6F is a schematic view of a conductive bump disposed on an elongated portion of a post passivation interconnect (PPI) in accordance with some embodiments of the present disclosure.

In operation 606, a conductive bump 107 is mounted as in FIG. 6F. In some embodiments, the conductive bump 107 is disposed on the elongated portion 104b exposed from the polymer 105. In some embodiments, the conductive bump 107 is formed by attaching a solder material on the elongated portion 104b and then reflowing the solder material. In some embodiments, the conductive bump 107 is formed on the elongated portion 104b by pasting the soldering material over a stencil. In some embodiments, the conductive bump 107 has similar configuration as in FIG. 1 or FIG. 3.

In operation 607, a molding material 106 is disposed over the polymer 105 and around the conductive bump 107 to form a molding as in FIG. 6G. In some embodiments, the molding material 106 is disposed and then cured to form the molding. In some embodiments, the molding is formed by transfer molding or any other suitable operations. In some embodiments, the molding is formed conformal to a portion of an outer surface 107a of the conductive bump 107, so that the conductive bump 107 is partially protruded from a top surface 106c' of the molding. In some embodiments, the molding material 106 has similar configuration as in FIG. 1 or FIG. 3.

Figure 6H:
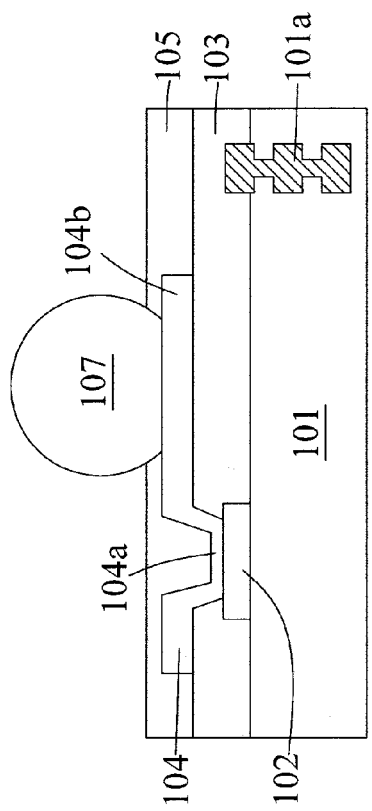
FIG. 6H is a schematic view of a molding material with a reduced height in accordance with some embodiments of the present disclosure.

In operation 608, a predetermined portion of the molding material 106 is removed as in FIG. 6H. In some embodiments, the semiconductor device 700 having similar configuration as the semiconductor device 100 in FIG. 1 or the semiconductor device 300 in FIG. 3 is formed after removing the predetermined portion of the molding material 106. In some embodiments, the predetermined portion of the molding material 106 orthogonally aligned with the alignment feature 101a and adjacent to an edge 100a of the semiconductor device 700 is removed, thereby the alignment feature 101a is visible through the molding material 106 under a predetermined radiation such as IR.

In some embodiments, the predetermined portion is removed by grinding the molding material 106 from the top surface 106c' (referring to FIG. 6G) of the molding material 106. In some embodiments, the predetermined portion of the molding material 106 is removed by reducing the molding material 106 in a height towards the alignment feature 101a from the top surface 106c' (referring to FIG. 6G) to the top surface 106c to form a first portion 106a and a second portion 106b.

In some embodiments, the first portion 106a of the molding material 106 is disposed corresponding to a position of the alignment feature 101a. In some embodiments, the first portion 106a is disposed above the alignment feature 101a. In some embodiments, the second portion 106b of the molding material 106 has a thickness greater than the first portion 106 and thus is not penetrable by the predetermined radiation.

In some embodiments, the predetermined portion of the molding material 106 is removed by any suitable operations such as grinding, kerf cutting, laser sawing, etc. In some embodiments, the predetermined portion of the molding material 106 is removed by a kerf which has a width greater than about 80 um.

Figure 7:
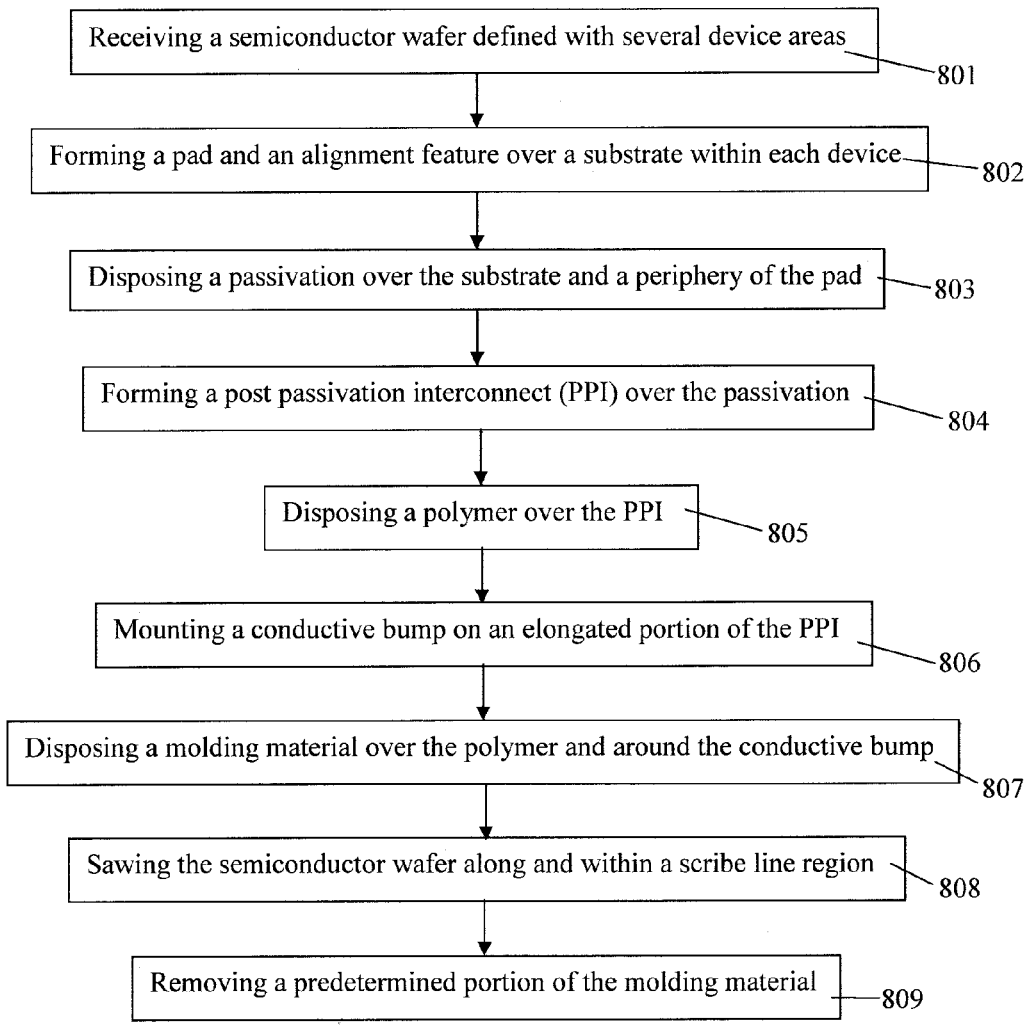
FIG. 7 is a flow diagram of a method of manufacturing a semiconductor device in accordance with some embodiments of the present disclosure.

FIG. 7 is a diagram of a method 800 of manufacturing a semiconductor device in accordance with various embodiments of the present disclosure. The method 800 includes a number of operations (801, 802, 803, 804, 805, 806, 807, 808 and 809).

Figure 8A:
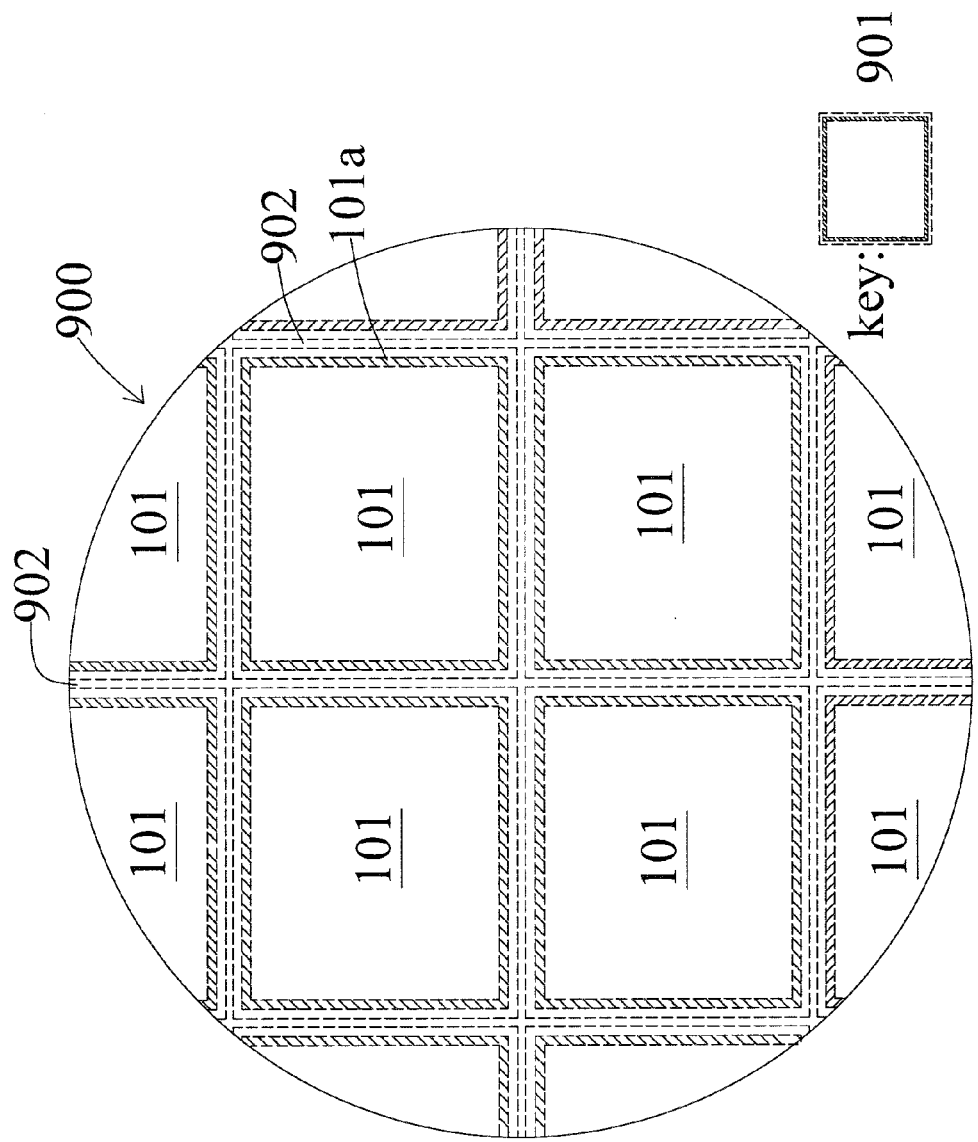
FIG. 8A is a top view of a semiconductor wafer defined with several device areas in accordance with some embodiments of the present disclosure.

In operation 801, a semiconductor wafer 900 is received as in FIG. 8A. In some embodiments, the semiconductor wafer 900 is defined with several device areas 901. In some embodiments, the device areas 901 are arranged in an array and aligned with each other in rows and columns. In some embodiments, the device areas 901 are divided by several scribe line regions 902. In some embodiments, each device area 901 includes a substrate 101. In some embodiments, the substrate 101 has similar configuration as in FIG. 1 or FIG. 3.

In operations 802-807, a pad 102, an alignment feature 101a, a passivation 103, a PPI 104, a polymer 105, a conductive bump 107 and a molding material 106 are disposed and formed similar to the operations 602-607 of FIG. 6 respectively. In some embodiments, each device area 901 includes the alignment feature 101a on or within the substrate 101. In some embodiments, the alignment feature 101a is a seal ring structure. In some embodiments, the pad 102, the alignment feature 101a, the passivation 103, the PPI 104, the polymer 105, the conductive bump 107 and the molding material 106 have similar configuration as in FIG.

Figure 8B:
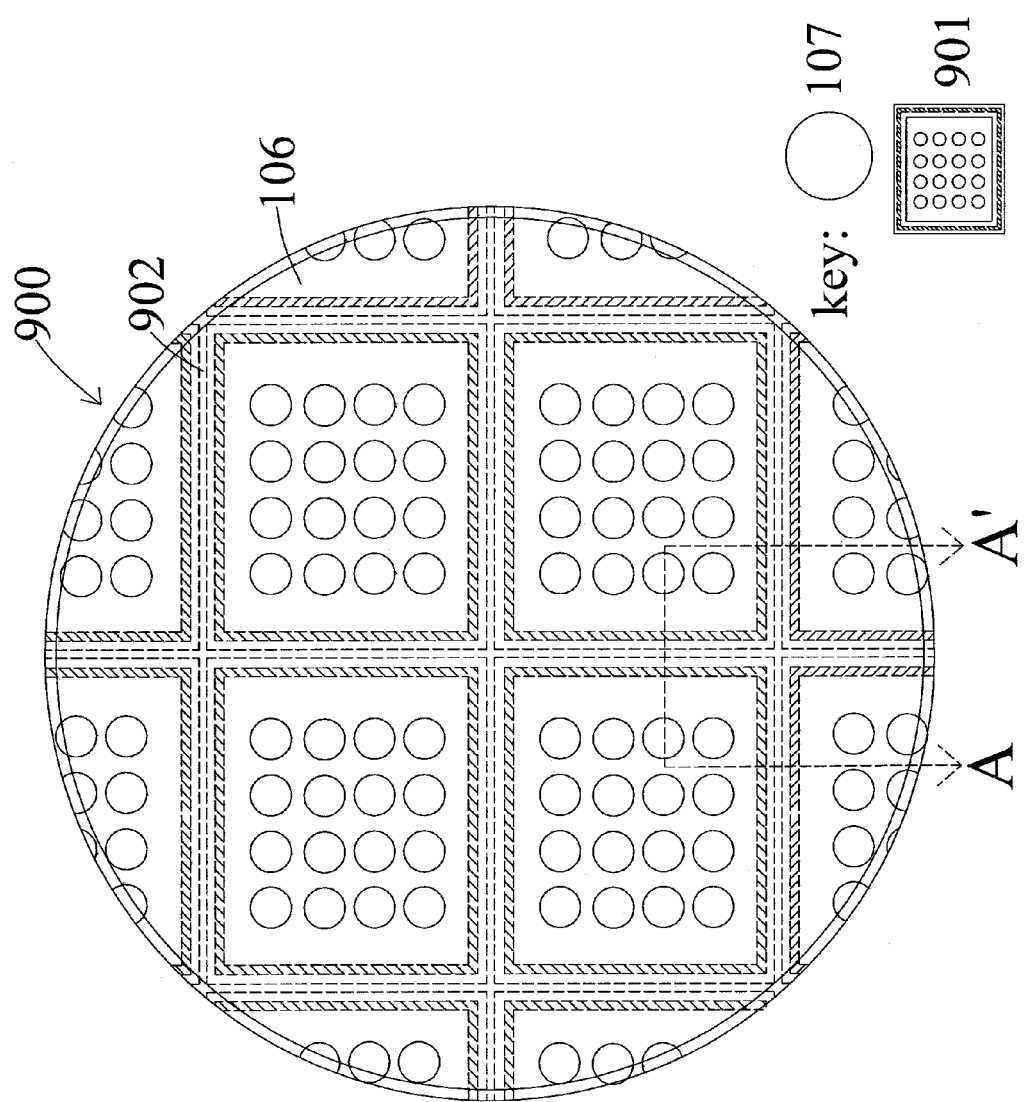
FIG. 8B is a top view of a semiconductor wafer substantially covered by a molding material in accordance with some embodiments of the present disclosure.
Figure 8C:
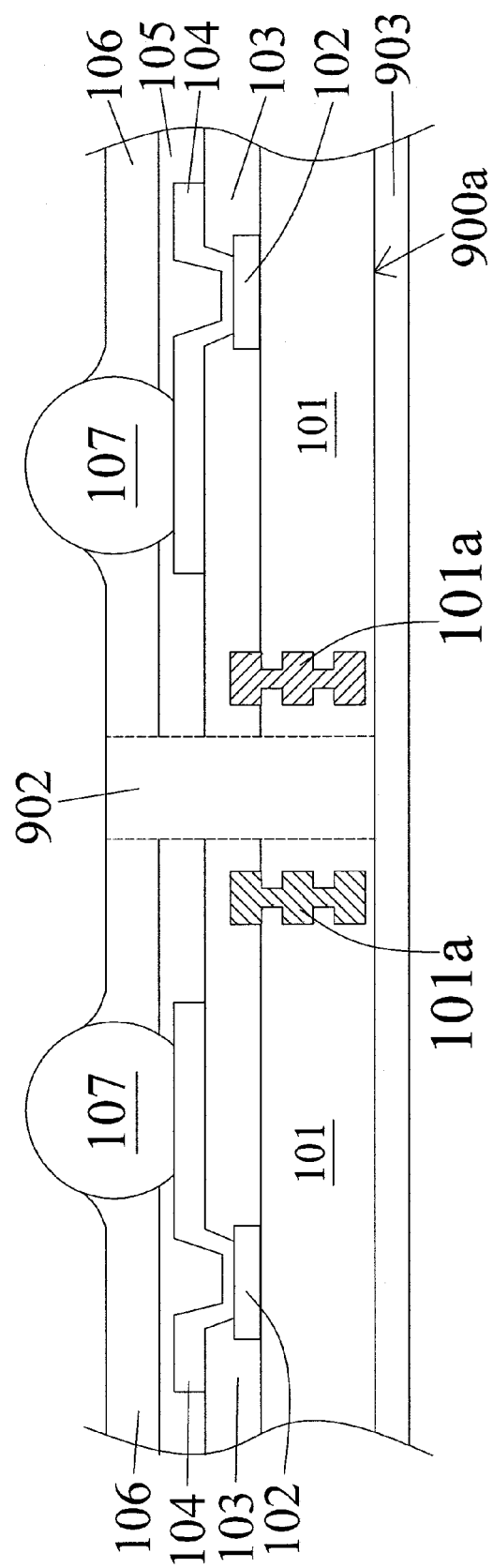
FIG. 8C is a cross sectional view of a semiconductor wafer of FIG. 8B along AA' in accordance with some embodiments of the present disclosure.

1 or FIG. 3. In operation 807, the semiconductor wafer 900 is substantially covered by the molding material 106, and several conductive bumps 107 are partially protruded from the molding material 106 as in FIG. 8B. FIG. 8C is a cross sectional view of the semiconductor wafer 900 along AA' of FIG. 8B. In some embodiments, a backside of the semiconductor wafer 900 is attached with a die attach film (DAF) or a dicing tape 903 for subsequent sawing operations.

Figure 8D:
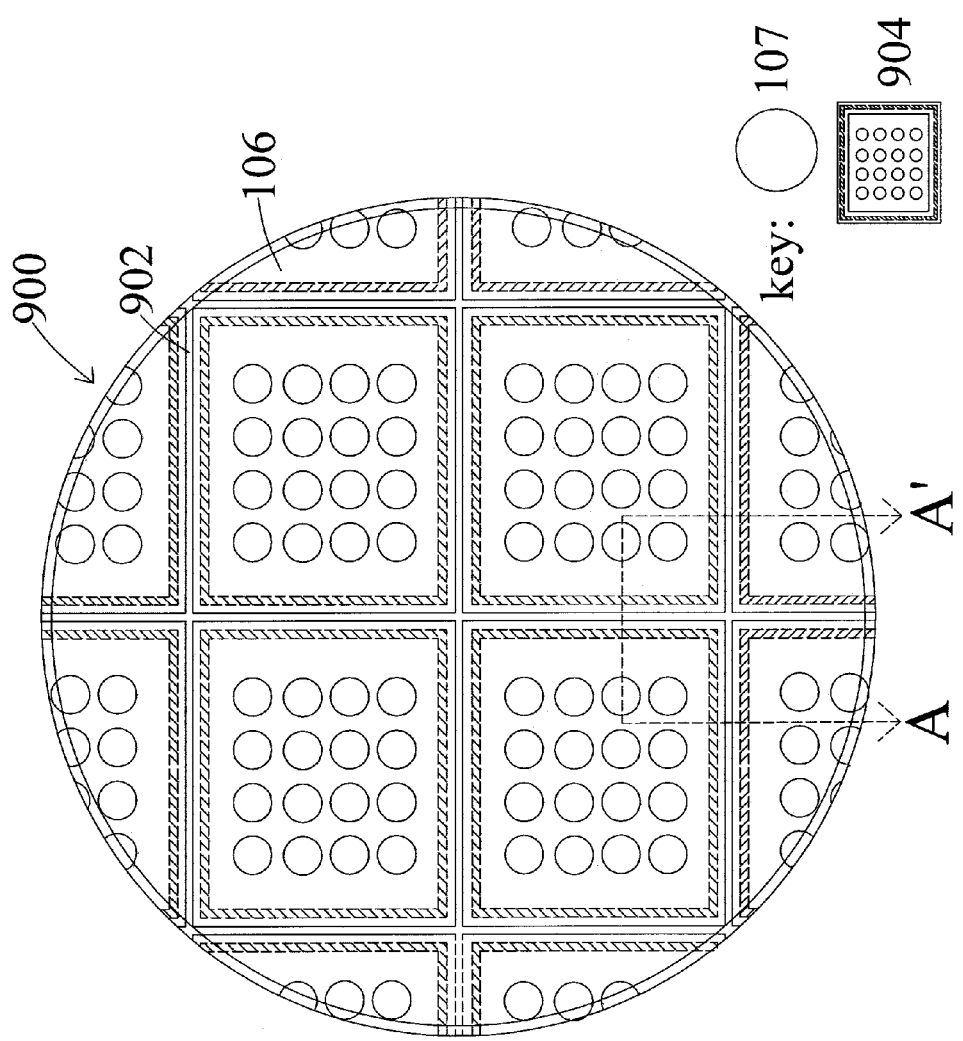
FIG. 8D is a top view of a semiconductor wafer sawn along several scribe line regions in accordance with some embodiments of the present disclosure.
Figure 8E:
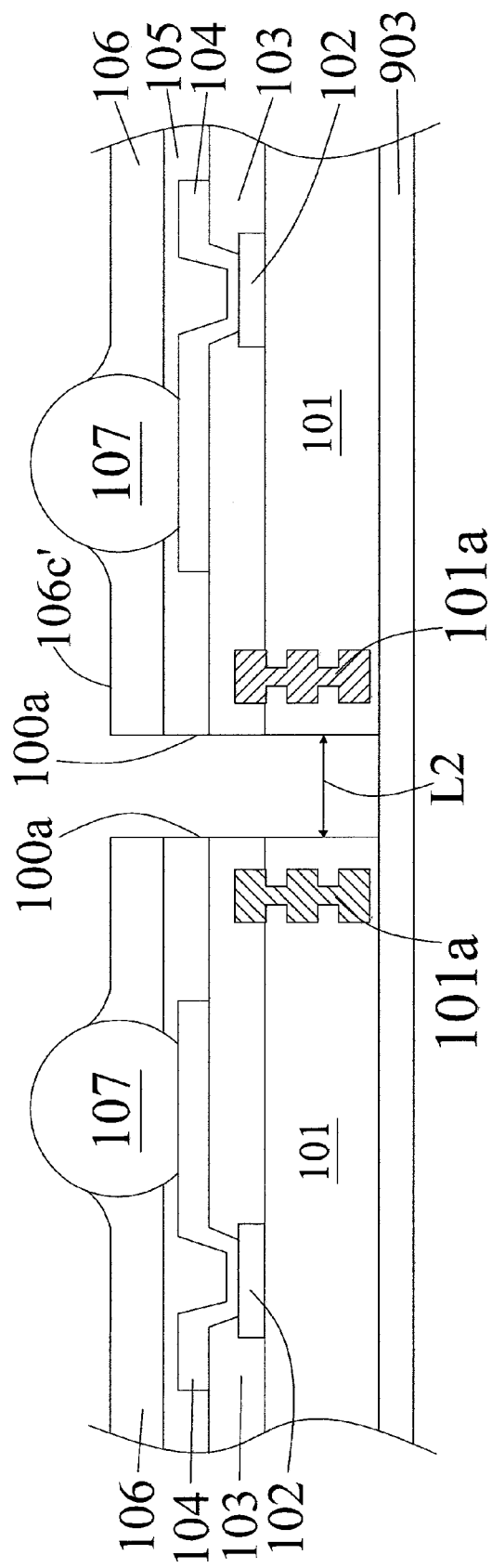
FIG. 8E is a cross sectional view of adjacent semiconductor devices of FIG. 8D along AA' in accordance with some embodiments of the present disclosure.

In operation 808, the semiconductor wafer 900 is sawn along and within the scribe line regions 902 as in FIG. 8D. In some embodiments, several semiconductor devices 904 are formed after the sawing operations. FIG. 8E is a cross sectional view of the adjacent semiconductor devices 904 along AA' of FIG. 8D. In some embodiments, the semiconductor wafer 900 is sawn by a kerf or other suitable tools from a top surface 106c' of the molding 106 to the substrate 101 in accordance with the scribe line regions 902. In some embodiments, the adjacent semiconductor devices 904 are separated from each other in a distance L2. In some embodiments, the distance L2 between edges 100a of the adjacent semiconductor devices 904 is about 25 um to about 35 um.

Figure 8F:
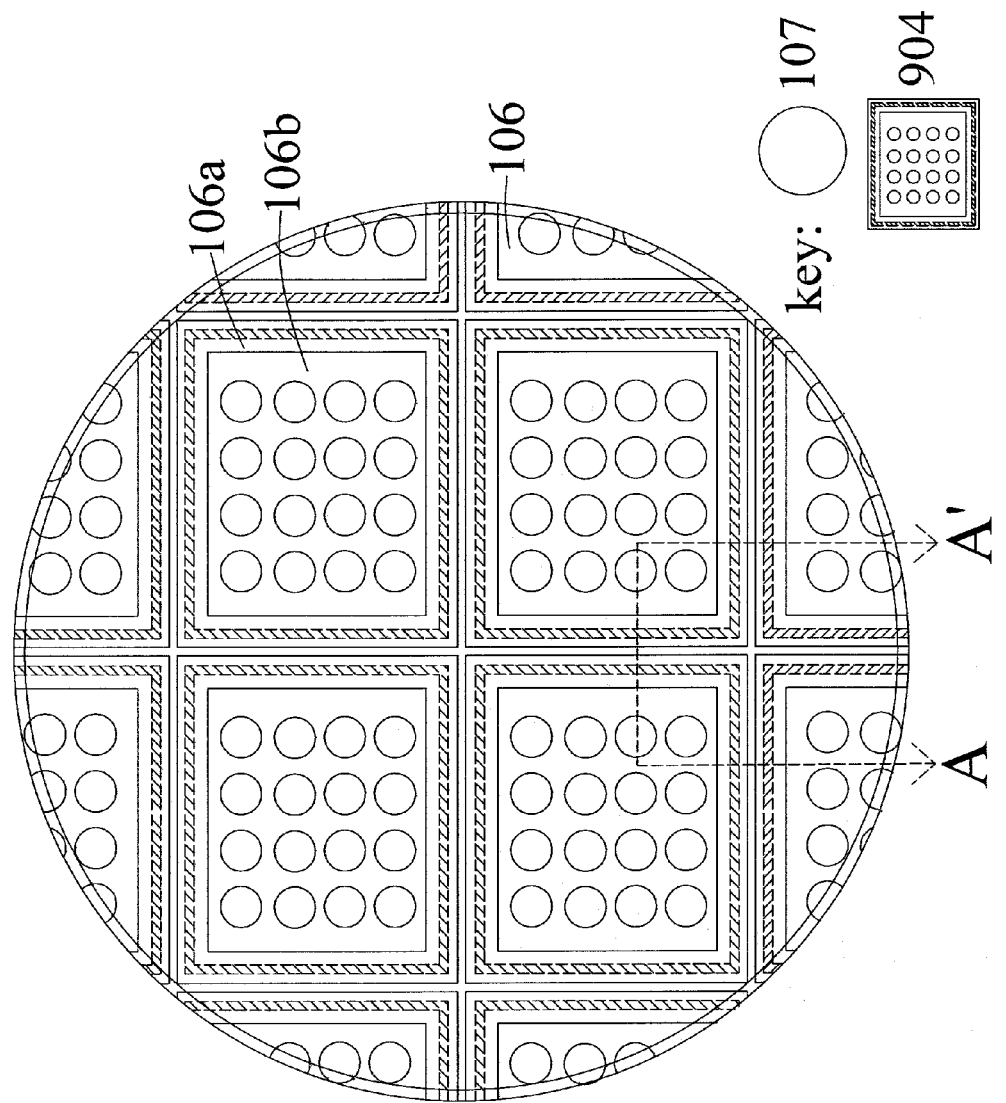
FIG. 8F is a top view of several semiconductor devices with the molding material in reduced heights in accordance with some embodiments of the present disclosure.
Figure 8G:
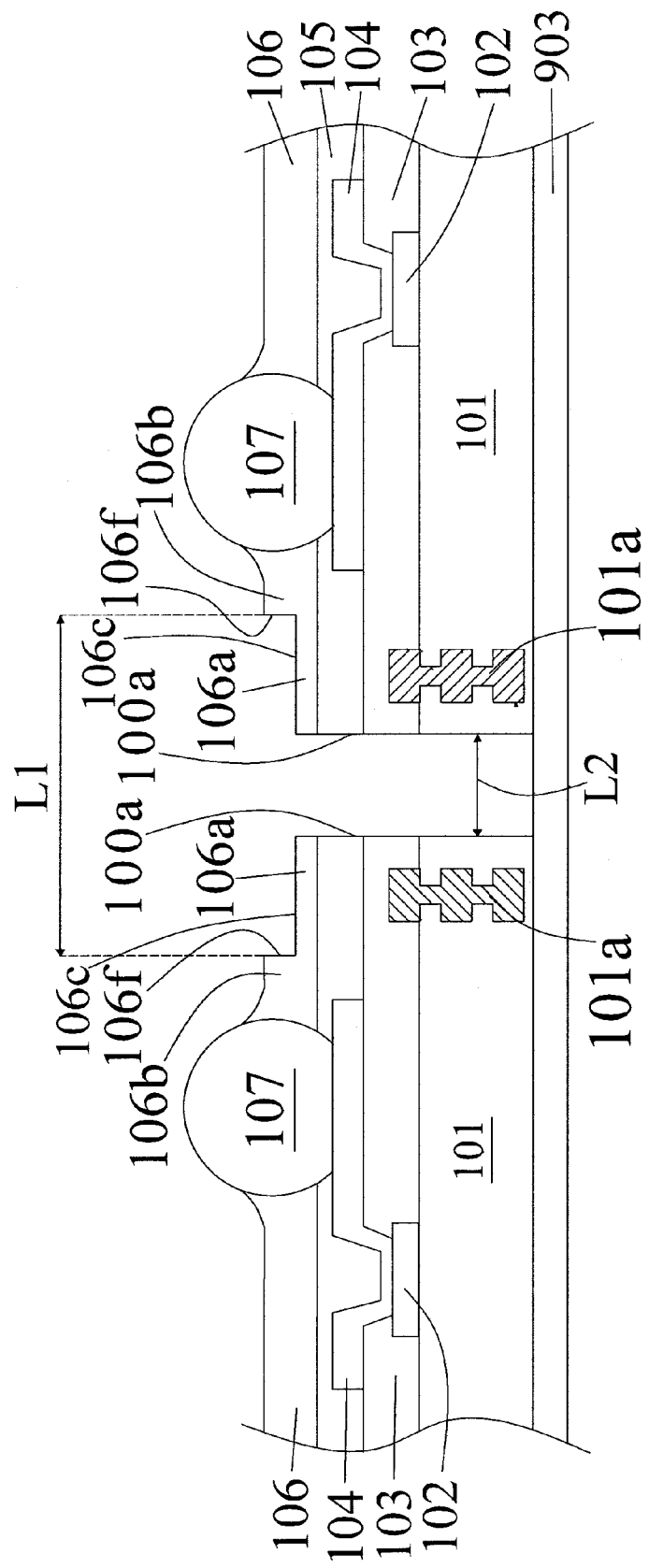
FIG. 8G is a cross sectional view of adjacent semiconductor devices of FIG. 8F along AA' in accordance with some embodiments of the present disclosure.

In operation 809, several predetermined portions of the molding material 106 are removed as in FIG. 8F. FIG. 8G is a cross sectional view of the adjacent semiconductor devices 904 along AA' of FIG. 8F. In some embodiments, the predetermined portions of the molding material 106 orthogonally aligned with the alignment features 101a are removed, so that first portions 106a and second portions 106b of the molding material 106 are formed. In some embodiments, the predetermined portions of the molding material 106 are removed by grinding the molding material 106 from the top surface 106c' (referring to FIG. 8E) towards the substrate 101 along the scribe line region 902 using a kerf with a width greater than the scribe line region 902. In some embodiments, the molding material 106 is ground from the top surface 106c' until the alignment feature 101a is visible through the molding material 106 under the predetermined radiation such as IR. The predetermined portions of the molding material 106 are removed and the first portion 106a and the second portion 106b are formed, such that the alignment feature 101a is visible through the molding material 106 under the predetermined radiation.

In some embodiments, the second portions 106b of the adjacent semiconductor devices 904 are separated from each other in a distance L1. In some embodiments, the distance L1 between sidewalls 106f is about 80 um to about 120 um. In some embodiments, the distance L1 is substantially greater than the scribe line region 902 (referring to FIG. 8C).

Figure 8H:
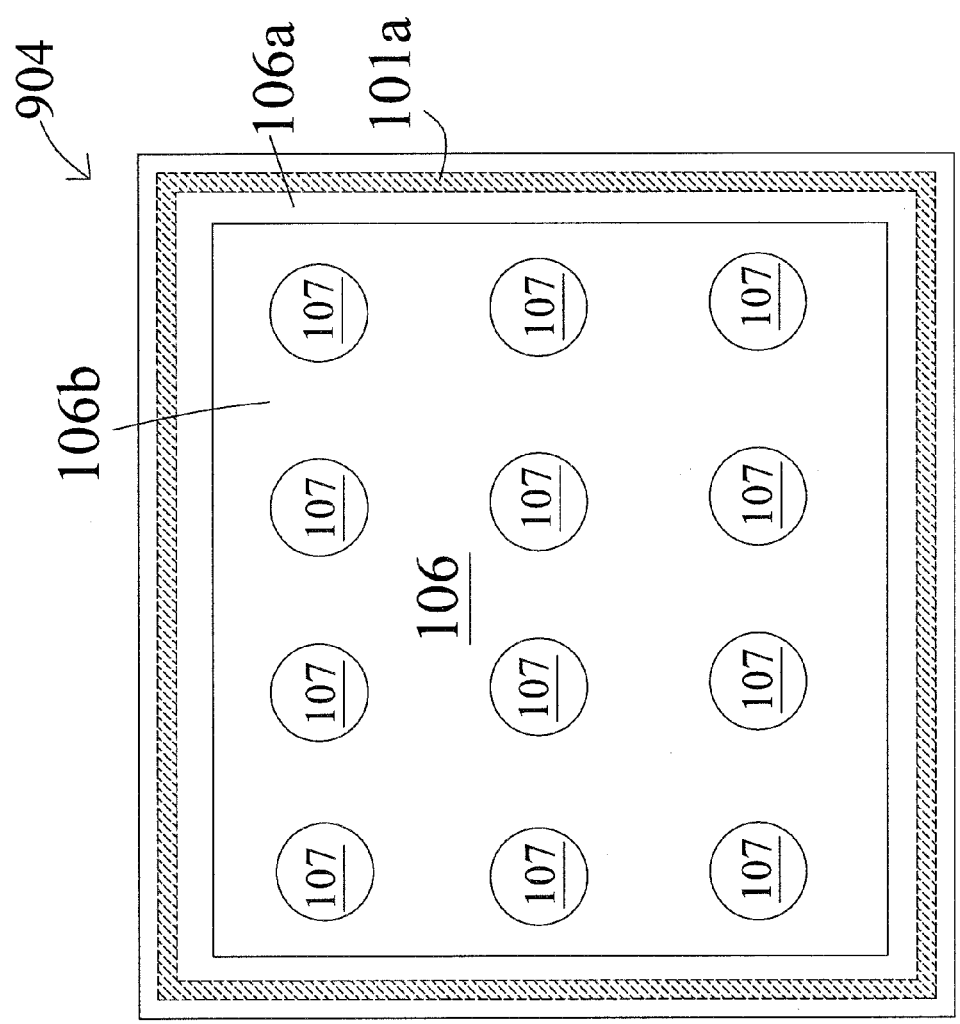
FIG. 8H is a top view of a semiconductor device of FIG. 8F with a first portion and a second portion of a molding material in accordance with some embodiments of the present disclosure.

In some embodiments, the semiconductor device 904 having the first portion 106a and the second portion 106b is formed as shown in FIG. 8H and FIG. 8I. FIG. 8H is a top view of the semiconductor device 904 and FIG. 8I is a cross sectional view of the semiconductor device 904. In some embodiments, the semiconductor device 904 has similar configuration as the semiconductor device 300 in FIG. 3 and FIG. 3A.

In some embodiments, the semiconductor device 904 is electrically connected with another substrate 400 or circuit board by bonding the conductive bump 107 of the semiconductor device 904 with a bond pad 400 on another substrate 400 as shown in FIG. 8J, similar to FIG. 4.

The present invention provides a semiconductor device with a structural improvement. The semiconductor device includes an opaque molding with a reduced height above an alignment feature, such that the alignment feature is visible from a top of a front side of a semiconductor device under a predetermined radiation. With reference to the visible alignment feature, the semiconductor device could be singulated from a semiconductor wafer accurately even though the singulation is performed after disposition of the opaque molding. Furthermore, a volume of the opaque molding disposed adjacent to the edge is lesser, and therefore a stress from the opaque molding adjacent to the edge is decreased and thus a reliability or performance of the semiconductor device is improved.

In some embodiments, a semiconductor device includes a substrate including a pad and an alignment feature disposed over the substrate, a passivation disposed over the substrate and a periphery of the pad, a post passivation interconnect (PPI) including a via portion disposed on the pad and an elongated portion receiving a conductive bump to electrically connect the pad with the conductive bump, a polymer covering the PPI, and a molding material disposed over the polymer and around the conductive bump, wherein the molding material comprises a first portion orthogonally aligned with the alignment feature and adjacent to an edge of the semiconductor device and a second portion distal to the edge of the semiconductor device, a thickness of the first portion is substantially smaller than a thickness of the second portion, thereby the alignment feature is visible through the molding material under a predetermined radiation.

In some embodiments, the thickness of the first portion is about 90 um less than the thickness of the second portion. In some embodiments, the molding material adjacent to the edge of the semiconductor device is in a stepped configuration. In some embodiments, the first portion of the molding material is disposed at a corner of the semiconductor device. In some embodiments, the predetermined radiation is infra-red (IR). In some embodiments, the thickness of the first portion of the molding material is about 10 um to about 30 um. In some embodiments, the thickness of the second portion of the molding material is about 100 um to about 120 um. In some embodiments, the alignment feature is disposed about 20 um away from a top surface of the first portion of the molding material. In some embodiments, the alignment feature is disposed about 20 um away from the edge of the semiconductor device. the alignment feature is a seal ring structure or an alignment mark. In some embodiments, the second portion of the molding material is opaque and is impenetrable by the predetermined radiation.

In some embodiments, a semiconductor device includes a substrate including a pad and an alignment feature disposed over the substrate, a passivation disposed over the substrate and a periphery of the pad, a conductive line electrically connecting the pad with a conductive bump seating on a portion of the conductive line, and an opaque molding surrounding the conductive bump, wherein the opaque molding with a reduced height is disposed corresponding to a position of the alignment feature, thereby the alignment feature is visible through the opaque molding under a predetermined radiation.

In some embodiments, the opaque molding with the reduced height is about 20 um. the alignment feature is a seal ring structure embedded in the substrate. In some embodiments, the opaque molding is a liquid molding compound (LMC).

In some embodiments, a method of manufacturing a semiconductor device includes receiving a substrate, forming a pad and an alignment feature over the substrate, disposing a passivation over the substrate and a periphery of the pad, forming a post passivation interconnect (PPI) over the passivation, disposing a polymer over the PPI, mounting a conductive bump on an elongated portion of the PPI exposed from the polymer to electrically connect with the pad, disposing a molding material over the polymer and around the conductive bump, and removing a predetermined portion of the molding material orthogonally aligned with the alignment feature and adjacent to an edge of the semiconductor device, thereby the alignment feature is visible through the molding material under a predetermined radiation.

In some embodiments, the removing the predetermined portion of the molding material includes reducing the molding material in a height towards the alignment feature. In some embodiments, the removing the predetermined portion of the molding material includes grinding the molding material from a top surface of the molding material. In some embodiments, the predetermined portion of the molding material is removed by a kerf with a width of greater than about 80 um. In some embodiments, the predetermined portion of the molding material includes forming a first portion of the molding material disposed corresponding to a position of the alignment feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate including a pad and an alignment feature disposed over the substrate;
   a passivation disposed over the substrate and a periphery of the pad and including a sidewall adjacent to the alignment feature;
   a post passivation interconnect (PPI) disposed over the passivation and including a via portion disposed on the pad and an elongated portion receiving a conductive bump to electrically connect the pad with the conductive bump; and
   a molding material disposed over the substrate, the passivation and the PPI and surrounding the conductive bump,
   wherein the molding material comprises a first portion orthogonally aligned with the alignment feature, a second portion disposed over the PPI and surrounding the conductive bump and a third portion extending along the sidewall of the passivation towards the substrate to at least partially surround the passivation, a thickness of the first portion is substantially smaller than a thickness of the second portion.

2. The semiconductor device of claim 1, wherein the thickness of the first portion is about 90 um less than the thickness of the second portion.

3. The semiconductor device of claim 1, wherein the molding material adjacent to an edge of the semiconductor device is in a stepped configuration.

4. The semiconductor device of claim 1, wherein the first portion of the molding material is disposed at a corner of the semiconductor device.

5. The semiconductor device of claim 1, wherein the alignment feature is visible through the first portion of the molding material under infra-red (IR).

6. The semiconductor device of claim 1, wherein the thickness of the first portion of the molding material is about 10 um to about 30 um.

7. The semiconductor device of claim 1, wherein the thickness of the second portion of the molding material is about 100 um to about 120 um.

8. The semiconductor device of claim 1, wherein the alignment feature is disposed about 20 um away from a top surface of the first portion of the molding material.

9. The semiconductor device of claim 1, wherein the alignment feature is disposed about 20 um away from an edge of the semiconductor device.

10. The semiconductor device of claim 1, wherein the alignment feature is a seal ring structure or an alignment mark.

11. The semiconductor device of claim 1, wherein the molding material is opaque and is impenetrable by visible light.

12. A semiconductor device, comprising:
   a substrate including a surface, a pad disposed over the surface and an alignment feature disposed over the surface and extended into the substrate;
   a passivation covering a periphery of the pad and the alignment feature, and including a sidewall adjacent to the alignment feature;
   a post passivation interconnect (PPI) electrically connecting the pad with a conductive bump seating on a portion of the post passivation interconnect (PPI); and
   a molding material disposed over the substrate, the passivation and the PPI and surrounding the conductive bump,
   wherein the molding material comprises a first portion orthogonally aligned with the alignment feature, a second portion disposed over the PPI and surrounding the conductive bump and a third portion extending along the sidewall of the passivation and interfacing with the sidewall of the passivation and at least a portion of the surface of the substrate, a thickness of the first portion is substantially smaller than a thickness of the second portion.

13. The semiconductor device of claim 12, wherein the first portion of the molding material is disposed between the second portion of the molding material and the third portion of the molding material.

14. The semiconductor device of claim 12, wherein the first portion of the molding material at least partially encloses the second portion of the molding material.

15. The semiconductor device of claim 12, wherein the molding material is conformal to a portion of an external surface of the conductive bump.

16. A semiconductor device, comprising:
   a substrate including a pad disposed over the substrate and an alignment feature disposed on or within the substrate;
   a passivation disposed over the substrate and a periphery of the pad and including a sidewall adjacent to the alignment feature;
   a post passivation interconnect (PPI) electrically connecting the pad with a conductive bump seating on a portion of the post passivation interconnect (PPI); and
   an opaque molding disposed over the substrate, the passivation and the PPI and surrounding the conductive bump, wherein the opaque molding includes a portion extending along the sidewall of the passivation and interfacing with the sidewall of the passivation and the substrate to at least partially surround the passivation.

17. The semiconductor device of claim 16, wherein the portion of the opaque molding is protruded into the substrate.

18. The semiconductor device of claim 16, wherein a thickness of the portion of the opaque molding is increased from the sidewall of the passivation to an edge of the semiconductor device.

19. The semiconductor device of claim 16, wherein the portion of the opaque molding surrounds at least a portion of the alignment feature.

20. The semiconductor device of claim 16, wherein the opaque molding is a liquid molding compound (LMC).

* * * * *